(12) United States Patent
Imai et al.

(10) Patent No.: US 12,718,852 B2
(45) Date of Patent: Aug. 25, 2026

(54) MEMORY DEVICE WITH SUB-ARRAYS AND SELECTION SWITCHES FOR REDUCING BIT LINE INTERFERENCE

(71) Applicant: ROHM CO., LTD., Kyoto (JP)

(72) Inventors: Takeharu Imai, Kyoto (JP); Tengai Kubo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 162 days.

(21) Appl. No.: 18/591,319

(22) Filed: Feb. 29, 2024

(65) Prior Publication Data

US 2024/0203465 A1 Jun. 20, 2024

Related U.S. Application Data

(63) Continuation of application No. PCT/JP2022/032028, filed on Aug. 25, 2022.

(30) Foreign Application Priority Data

Sep. 8, 2021 (JP) ................................ 2021-146408

(51) Int. Cl.
*G11C 7/10* (2006.01)
*G11C 7/12* (2006.01)
(Continued)

(52) U.S. Cl.
CPC ............ *G11C 7/1063* (2013.01); *G11C 7/106* (2013.01); *G11C 7/12* (2013.01)

(58) Field of Classification Search
CPC ......... G11C 7/1063; G11C 7/106; G11C 7/12; G11C 11/1659; G11C 11/1675;
(Continued)

(56) References Cited

U.S. PATENT DOCUMENTS 4,888,772 A * 12/1989 Tanigawa ............... G11C 29/34 714/719
5,894,441 A * 4/1999 Nakazawa ............. G11C 29/80 365/200
(Continued)

FOREIGN PATENT DOCUMENTS

JP H0652635 B2 * 7/1994 ............. G11C 11/34
JP 2017-174485 9/2017

OTHER PUBLICATIONS

Translation of JP H0652635 B2 (JP S61123094 A) (Year: 1994).*
(Continued)

*Primary Examiner* — Sultana Begum
*Assistant Examiner* — Elizabeth Rose Agger
(74) *Attorney, Agent, or Firm* — Fish & Richardson P.C.

(57) ABSTRACT

Upper bit lines extend along Y direction in an upper memory array and a Y decoder. Lower bit lines extend along Y direction in a lower memory array and the Y decoder. The Y decoder includes an upper Y line selection switch connected to the upper bit lines and a lower Y line selection switch connected to the lower bit lines and disposed at the other side of the upper Y line selection switch along Y direction. A switch circuit is configured to be capable of switching to permit either conduction between a sense amplifier and the upper Y line selection switch or conduction between the sense amplifier and the lower Y line selection switch.

10 Claims, 15 Drawing Sheets

(51) Int. Cl.

| | |
|---|---|
| ***G11C 11/16*** | (2006.01) |
| ***G11C 13/00*** | (2006.01) |
| ***G11C 16/08*** | (2006.01) |
| ***G11C 16/12*** | (2006.01) |
| ***G11C 16/24*** | (2006.01) |
| ***G11C 16/26*** | (2006.01) |
| *G11C 7/06* | (2006.01) |
| *G11C 16/04* | (2006.01) |

(58) Field of Classification Search

CPC ............ G11C 13/0004; G11C 13/0026; G11C 13/0028; G11C 16/0483; G11C 16/08; G11C 16/10; G11C 16/12; G11C 7/067; G11C 16/24; G11C 16/26

See application file for complete search history.

(56) References Cited

U.S. PATENT DOCUMENTS

| | | | | |
|---|---|---|---|---|
| 6,032,248 A * | 2/2000 | Curry | G11C 16/08 | 712/37 |
| 10,867,681 B2 * | 12/2020 | Clinton | G11C 16/08 | |
| 2004/0008549 A1 * | 1/2004 | Micheloni | G11C 29/82 | 365/200 |

OTHER PUBLICATIONS

International Search Report and Written Opinion in International Appln. No. PCT/JP2022/032028, mailed on Nov. 1, 2022, 13 pages (with machine translation).

* cited by examiner

MDV10
10
20
30
40
MEMORY ARRAY
X DECODER
Y DECODER
SAMP
MDV1
1A
1AA
3
1B
2A
2B
4
MEMORY ARRAY
Y DECODER
MEMORY ARRAY
X DECODER
SAMP
X DECODER
X
Y

MDV1
CPout
VPPMV
NM10
31B
A
VPP WRGEN
VPP_WT_B
IV11
NO1
NO2
31A
WR_DIS
VPP WRGEN
VPP_WT_A
SWR
DL_WR
NM11,NM12
321
32
PM_A
PM_B
322
MC_A
MT_A
SW_A
WL_A
ST_A
BL_A
SL
YS_A
BL_A
SA
NM_A
DL_RD_A
DL_RD
DL_RD_B
IV21
NM_B
A
NO11
SRWL_SEL
SWC
YDEC
YS_B
BL_B
BL_B
34
COLLAT
ST_B
WL_B
MT_B
SW_B
MC_B
332
333
VPP_WT_B
VPP_WT_A
331
VN
33

MEMORY DEVICE WITH SUB-ARRAYS AND SELECTION SWITCHES FOR REDUCING BIT LINE INTERFERENCE

CROSS-REFERENCE TO RELATED APPLICATIONS

This nonprovisional application is a continuation application of International Patent Application No. PCT/JP2022/032028 filed on Aug. 25, 2022, which claims priority Japanese Patent Application No. 2021-146408 filed on Sep. 8, 2021, the entire contents of which are hereby incorporated by reference.

TECHNICAL FIELD

The present disclosure relates to memory devices.

BACKGROUND ART

Memory devices provided with memory cells are known. A memory cell includes a memory transistor. Some memory transistors have, for example, a control gate and a floating gate and applying a high voltage to the control gate permits injection and extraction of electrons with respect to the floating gate, thereby achieving deleting (erasing) and writing (programming) (see, for example, Patent Document 1 identified below).

CITATION LIST

Patent Literature

Patent Document 1: JP-A-2017-174485

DESCRIPTION OF EMBODIMENTS

An illustrative embodiment of the present disclosure will be described below with reference to the accompanying drawings.

1. Problems With Memory Devices

Prior to a description of embodiments of the present disclosure, problems with memory devices will be discussed.

Figure 8:
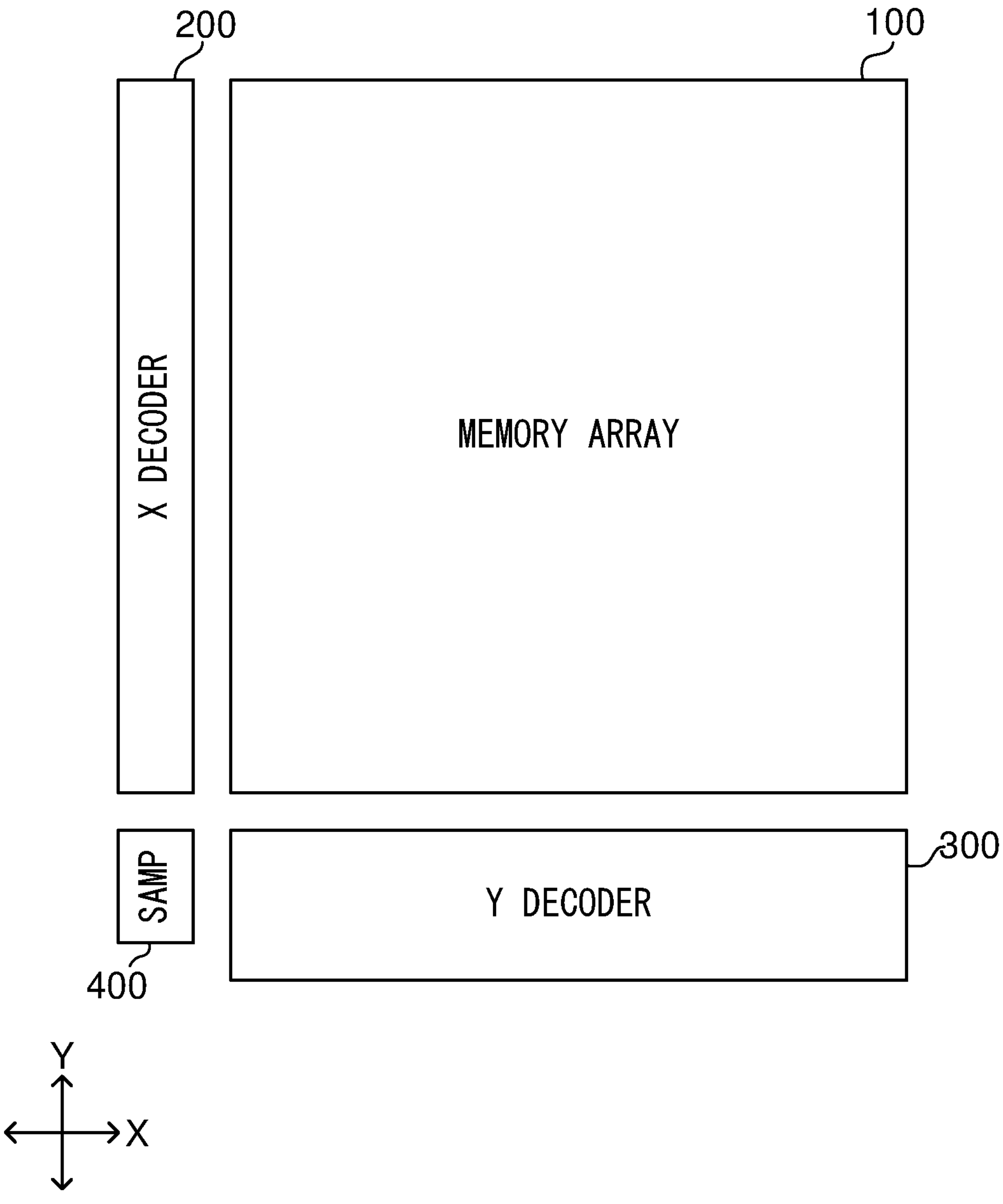
FIG. 8 is a schematic layout diagram showing the structure of a known memory device.

FIG. 8 is a schematic layout diagram showing the structure of a known memory device. In FIG. 8, mutually orthogonal directions, X and Y directions, are indicated. FIG. 8 is a plan view as seen from a direction perpendicular to both X and Y directions. The memory device shown in FIG. 8 includes a memory array 100, an X decoder 200, a Y decoder 300, and a sense amplifier region 400.

The memory array 100 is composed of unillustrated memory cells disposed in a matrix along X and Y directions. A memory cell can store one-bit data. The memory array 100 is a non-volatile memory and is configured as, for example, an EEPROM. The X decoder 200 and the Y decoder 300 are disposed around the memory array 100.

Word lines (not illustrated), which are address selection lines led out of the X decoder 200 to extend along X direction, cross the memory array 100 along X direction. Bit lines (not illustrated), which are address selection lines led out of the Y decoder 300 to extend along Y direction, cross the memory array 100 along Y direction.

In the sense amplifier region 400 are disposed a plurality of unillustrated sense amplifiers. In the memory array 100, as a unit by which reading (data read) and writing (data write) are performed, memory cells corresponding to a predetermined number of bits constitute a cell unit. The just-mentioned predetermined number of bits is, for example, 38 bits. In the sense amplifier region 400, a number (e.g., 38) of sense amplifiers corresponding the above-mentioned predetermined number of bits are disposed.

The X decoder 200 decodes an X-direction address signal to select a word line. The Y decoder 300 decodes a Y-direction address signal to select a bit line. In data reading, data is read from the memory cell corresponding to the selected word and bit lines by use of a sense amplifier. On the other hand, in data writing, a high voltage is applied to the memory cell corresponding to the selected word and bit lines to perform writing (write operation). The high voltage is applied by an unillustrated charge pump.

Figure 9:
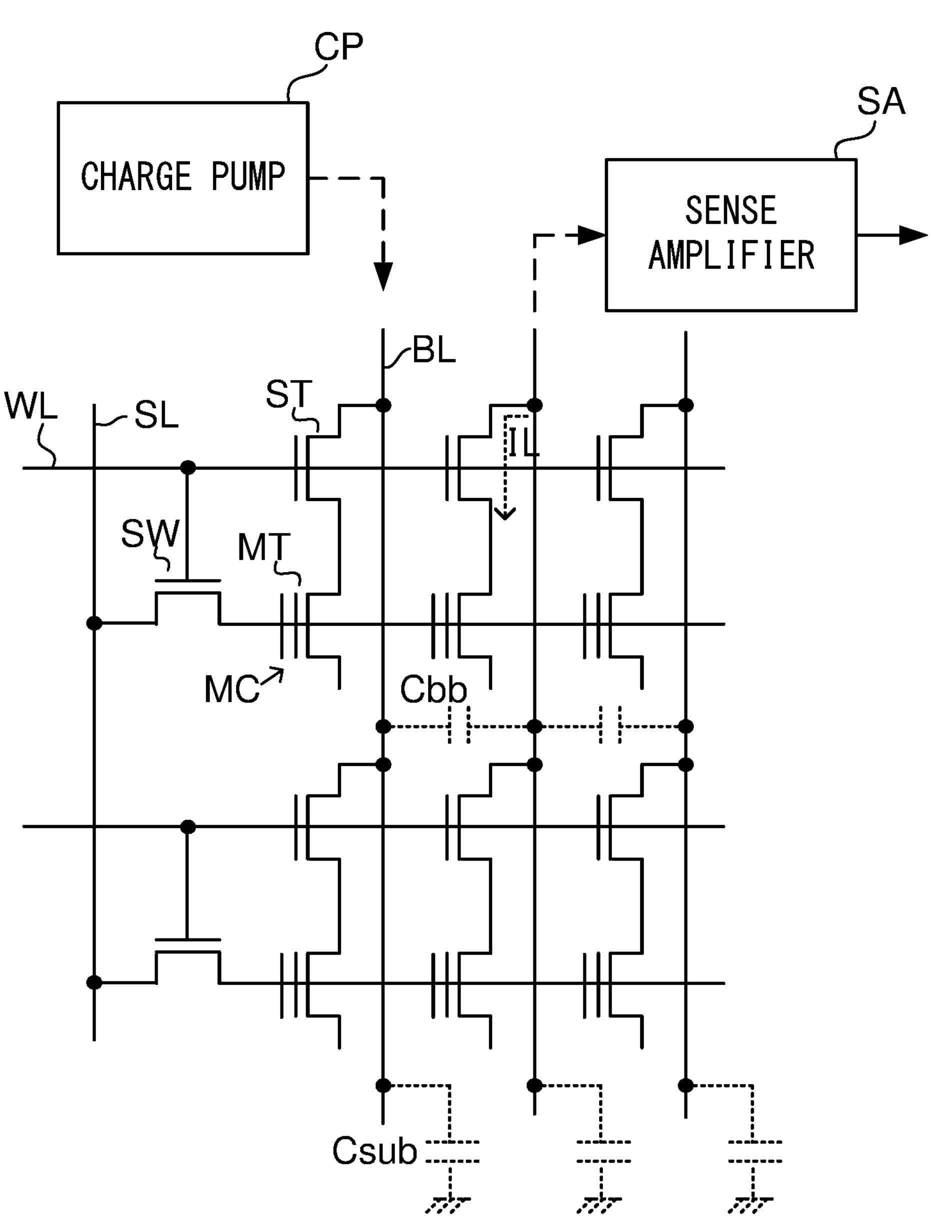
FIG. 9 is a diagram showing the configuration of part of a memory array.

FIG. 9 is a diagram showing the configuration of part of the memory array 100. As shown in FIG. 9, a memory cell MC includes a selection transistor ST and a memory transistor MT. The memory transistor MT has a control gate and a floating gate. The first terminal of the selection transistor ST is connected to a bit line BL. The second terminal of the selection transistor ST is connected to the first terminal of the memory transistor MT. To each bit line BL are connected a predetermined number (e.g., 512) of memory cells MC.

Each word line WL is connected to the control terminals (read gates) of the selection transistors ST arrayed in a row along X direction.

The memory array 100 is crossed by selection lines SL that extend along Y direction. Each selection line SL is connected to the first terminals of selection switches SW arrayed in a row along Y direction. The second terminal of each selection switch SW is connected to the control gates of a number of memory transistors MT corresponding to the above-mentioned predetermined number of bits that are arrayed in a row along X direction. The control terminal of a selection switch SW is connected to a word line WL.

A memory cell MC can be subjected to an erase operation (deleting) and a write operation (writing). In an erase operation, a high voltage (e.g., 17 V) is applied to a selected word line WL so that the corresponding selection transistor ST is turned on. Moreover, the selection switch SW corresponding to the selected word line WL is turned on so that, via a selection line SL, a high voltage (e.g., 17 V) is applied to the control gate of the corresponding memory transistor MT. Moreover, via the selected bit line BL, 0 V is applied to the first terminal of the just-mentioned corresponding memory transistor MT. Thus, electrons are injected to the floating gate of the memory transistor MT so that data "1" is written.

In a write operation, a high voltage (e.g., 17V) is applied to a selected word line WL so that the corresponding selection transistor ST is turned on. Moreover, the selection switch SW corresponding to the selected word line WL is turned on so that, via a selection line SL, 0 V is applied to the control gate of the corresponding memory transistor MT. Moreover, via the selected bit line BL, a high voltage (e.g., 14 V) is applied to the first terminal of the just-mentioned corresponding memory transistor MT. Thus, electrons are extracted from the floating gate of the memory transistor MT so that data "0" is written. To apply a high voltage via the bit line BL to the memory transistor MT, a charge pump CP as shown in FIG. 9 is used.

In a data read, a supply voltage (Vcc) is applied to a selected word line WL so that the corresponding selection transistor ST is turned on. Moreover, the selection switch SW corresponding the selected word line WL is turned on so that, via a selection line SL, a read voltage (e.g., 1.4 V) is applied to the control gate of the corresponding memory transistor MT. Then, via the selected bit line BL, data is read from the memory cell MC by a sense amplifier SA. The sense amplifier SA senses, if no current passes in the memory cell MC, "1" written in the memory transistor MT and, if a current passes in the memory cell MC, "0" written in the memory transistor MT.

Inconveniently, the known memory device described above poses problems as described below in miniaturization and capacity enhancement.

In data reading, the following three problems are encountered. The first problem is the influence of the parasitic capacitance Cbb present between adjacent bit lines BL. When a sense amplifier SA reads data, pre-charging is performed to charge the parasitic capacitance (Csub, described later) on a bit line BL. When data is read from a memory cell MC with data "0" written in it, a current passes in the memory cell MC, and thus electric charge is extracted from the parasitic capacitance on the bit line BL and thus the voltage on the bit line BL drops from the voltage resulting from pre-charging. The sense amplifier SA detects this drop in voltage. However, if "1" is written in the memory cell MC connected to an adjacent bit line BL, although no current passes in the memory cell MC and thus the voltage on the bit line BL should not drop from the voltage resulting from pre-charging, it may drop under the influence of the parasitic capacitance Cbb. Thus, where data "1" should be sensed to be written, data "0" may erroneously be sensed to be written (data corruption from "1" to "0").

The second problem is the influence of a leak current that passes in a memory cell MC at high temperature. In data reading, 0 V is applied to an unselected word line WL so that the corresponding selection transistor ST is off. Thus, the corresponding selection switch SW is off so that the control gate of the corresponding memory transistor MT is open. In a memory cell MC like this corresponding to an unselected word line WL, a leak current IL may pass at high temperature. Capacity enhancement may incur an increase in the number of memory cells MC connected to a bit line BL, possibly resulting in an increased leak current. If, with "1" written in a memory cell MC corresponding to a selected word line WL, an increased leak current as described passes in it, data "0" may erroneously be sensed to be written.

The third problem is the influence of a to-substrate parasitic capacitance Csub, that is, the parasitic capacitance on a bit line BL against the substrate. Capacity enhancement may incur an increase in the wiring length of a bit line BL and hence an increase in the capacitance value of the parasitic capacitance Csub. As a result, when data "0" written in a memory cell MC is read by a sense amplifier SA, the parasitic capacitance Csub influences to cause a drop in the speed at which the voltage on the bit line BL falls. This may lead to a drop in the sense speed of the sense amplifier SA.

On the other hand, in data writing, the following problem is encountered. Capacity enhancement may incur increases in the parasitic capacitance Csub and the leak current, possibly resulting in the charge pump CP being unable to perform the desired boosting operation with a low supply voltage.

2. First Comparative Example

Figure 10:
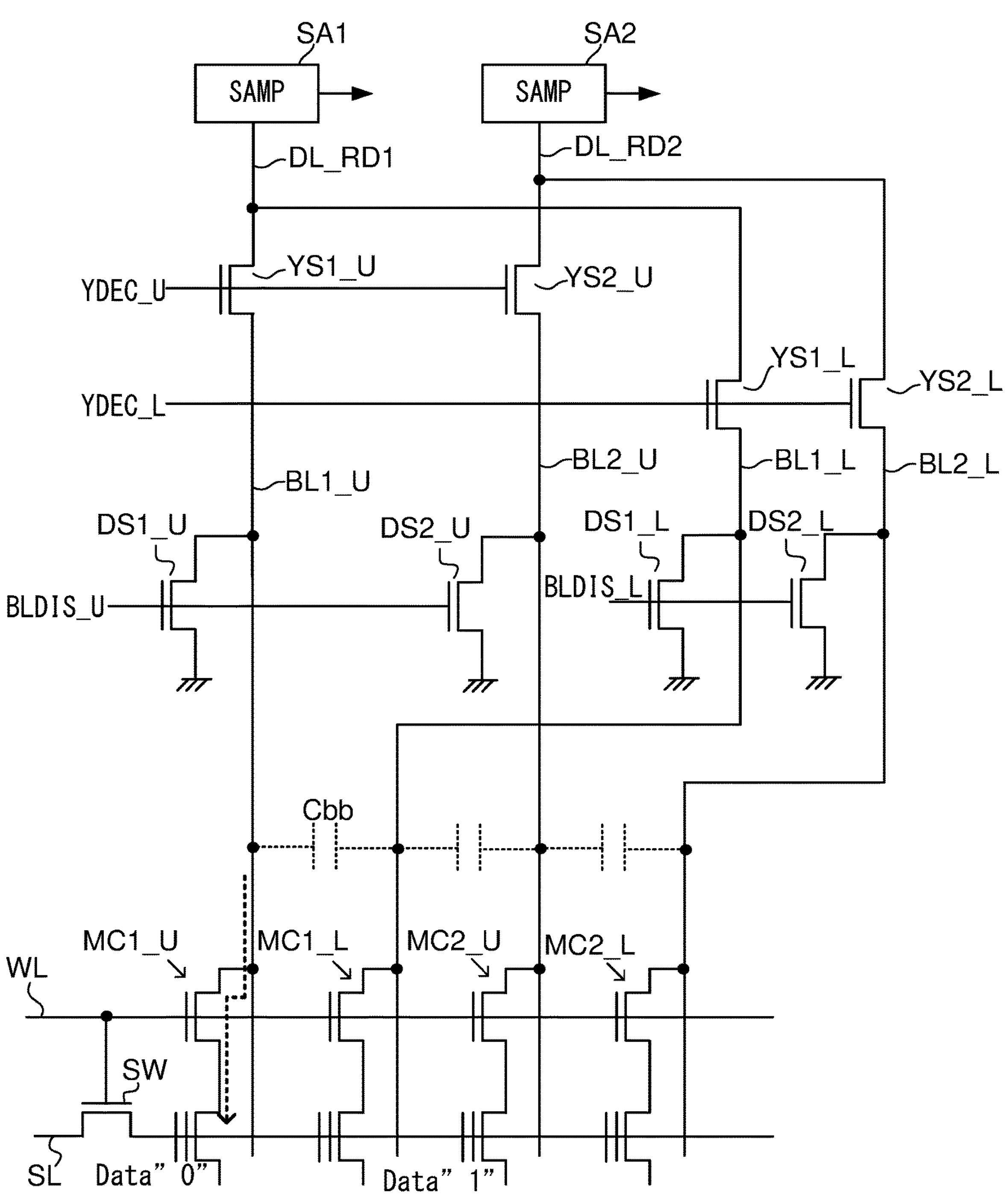
FIG. 10 is a diagram showing the configuration related to data reading in a memory device of a first comparative example.

An embodiment will now be described as a comparative example devised to solve the problems mentioned above. FIG. 10 is a diagram showing the configuration related to data reading in a memory device of the first comparative example. The first comparative example is implemented to solve the first problem mentioned above (i.e., interference between adjacent bit lines).

The configuration shown in FIG. 10 will be described. A sense amplifier SA1 is connected via a read data line DL_RD1 to the first terminal of a Y line selection switch YS1_U. The second terminal of the Y line selection switch YS1_U is connected to one end of a bit line BL1_U. The other end of the bit line BL1_U is connected to a memory cell MC1_U.

A sense amplifier SA2 is connected via a read data line DL_RD2 to the first terminal of a Y line selection switch YS2_U. The second terminal of the Y line selection switch YS2_U is connected to one end of a bit line BL2_U. The other end of the bit line BL2_U is connected to a memory cell MC2_U.

The memory cells MC1_U and MC2_U are upper memory cells. The Y line selection switches YS1_U and YS2_U are switched on and off by an upper Y line selection signal YDEC_U. With the Y line selection switches YS1_U and YS2_U on, the upper bit lines BL1_U and BL2_U are selected.

The first terminals of discharge switches DS1_U and DS2_U are connected to bit lines BL1_U and BL2_U halfway along each bit line. An application terminal for a ground potential is connected to the second terminals of the discharge switches DS1_U and DS2_U. The discharge switches DS1_U and DS2_U are switched on and off by an upper charge signal BLDIS_U. With the discharge switches DS1_U and DS2_U on, the bit lines BL1_U and BL2_U are discharged.

The sense amplifier SA1 is also connected via the read data line DL_RD1 to the first terminal of a Y line selection switch YS1_L. The second terminal of the Y line selection switch YS1_L is connected to one end of a bit line BL1_L. The other end of the bit line BL1_L is connected to a memory cell MC1_L.

The sense amplifier SA2 is also connected via the read data line DL_RD2 to the first terminal of a Y line selection switch YS2_L. The second terminal of the Y line selection switch YS2_L is connected to one end of a bit line BL2_L. The other end of the bit line BL2_L is connected to a memory cell MC2_L.

The memory cells MC1_L and MC2_L are lower memory cells. The Y line selection switches YS1_L and YS2_L are switched on and off by a lower Y line selection signal YDEC_L. With the Y line selection switches YS1_L and YS2_L on, the lower bit lines BL1_L and BL2_L are selected.

Halfway along the bit lines BL1_L and BL2_L, the first terminals of discharge switches DS1_L and DS2_L are connected to them. To the second terminals of the discharge switches DS1_L and DS2_L is connected the application terminal for the ground potential. The discharge switches DS1_L and DS2_L are switched on and off by a lower charge signal BLDIS_L. With the discharge switches DS1_L and DS2_L on, the bit lines BL1_L and BL2_L are discharged.

The Y line selection signals YDEC_U and YDEC_L are controlled complementarily. That is, when the upper Y selection switches YS1_U and YS2_U are on, the lower Y selection switches YS1_L and YS2_L are off; when the upper Y selection switches YS1_U and YS2_U are off, the lower Y selection switches YS1_L and YS2_L are on.

For example, when the upper Y selection switches YS1_U and YS2_U are on, the upper bit lines BL1_U and BL2_U are selected and the lower bit lines BL1_L and BL2_L are left unselected. In this case, the sense amplifiers SA1 and SA2 pre-charge the upper bit lines BL1_U and BL2_U and, according to whether a current pass through the upper memory cells MC1_U and MC2_U, data is read. Meanwhile, the unselected bit lines BL1_L and BL2_L are kept at the ground potential by the discharge switches DS1_L and DS2_L in the on state.

Here, as shown in FIG. 10, for example, if data "0" is written in the memory cell MC1_U, a current passes in the memory cell MC1_U and thus the voltage on the bit line BL1_U drops from the voltage after pre-charging. As shown in FIG. 10, the memory cells and bit lines are disposed such that upper and lower ones alternate. Accordingly, the lower bit line BL1_L is disposed adjacent to the upper bit lines BL1_U and BL2_U and has the ground potential. Thus, even if a parasitic capacitance Cbb is present between adjacent bit lines, the drop in the voltage on the bit line BL1_U does not influence the voltage on BL2_U. In this way, if data "1" is written in the memory cell MC2_U, the voltage on the bit line BL2_U is prevented from dropping from the voltage after pre-haring, and this prevents erroneous reading of data "0". It is thus possible to prevent data corruption resulting in interference between adjacent bit lines. Also when data is read from a lower memory cell, the upper bit lines are kept at the ground potential, and this provides the same effect as described above.

As described above, in the first comparative example, selected bit lines are shielded from each other with unselected bit lines between them to prevent interference between bit lines. Inconveniently, the first comparative example configured as described above poses the following problem. Consider, for example, a configuration where, when the data at a specified address (8 bits) is read, a set of data corresponding to 38 bits has to be read. The 38-bit data consists of 32 bits (corresponding to four addresses) plus 6-bit ECC (error correction code). In this case, with the configuration of the first comparative example described above, data needs to be read in two separate sessions, i.e., first the upper 19 bits and then the lower 19 bits. Inconveniently, when the data at the specified address is output serially, it is necessary to separately provide a period in which to detect and correct one-bit errors by use of the ECC and a period in which to select the data at the specified address from data corresponding to four addresses. This makes it impossible to secure during transmission of 8-bit data periods in which to read data in two separate sessions.

3. Second Comparative Example

Figure 11:
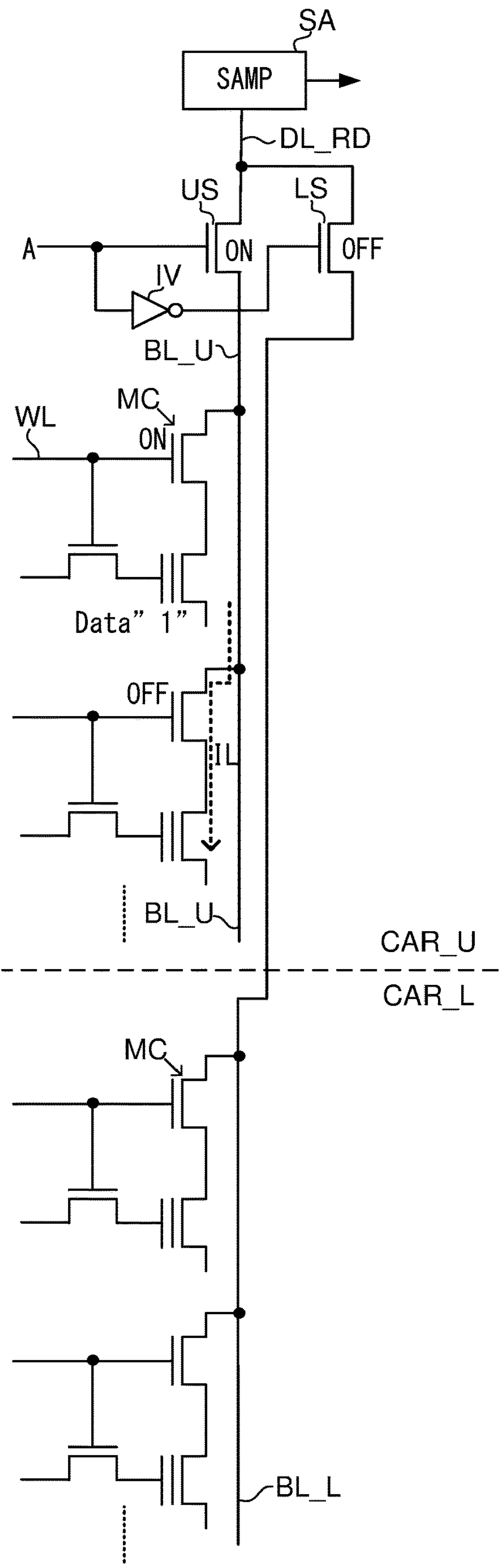
FIG. 11 is a diagram showing the configuration related to data reading in a memory device of a second comparative example.

FIG. 11 is a diagram showing the configuration related to data reading in a memory device of a second comparative example. The second comparative example is implemented to solve the second problem mentioned above (i.e., the influence of an increased leak current).

The configuration shown in FIG. 11 will be described. A sense amplifier SA is connected via a read data line DL_RD to the first terminal of an upper switch US and to the first terminal of a lower switch LS.

In the configuration in FIG. 11, a memory array is divided, along Y direction, into an upper cell array CAR_U and a lower cell array CAR_L. The second terminal of the upper switch US is connected to one end of an upper bit line BL_U. The upper bit line BL_U crosses the upper cell array CAR_U along Y direction, and has connected to it a predetermined number (e.g., 256) of memory cells MC. The second terminal of the lower switch LS is connected to one end of a lower bit line BL_L. The lower bit line BL_L crosses the upper cell array CAR_U along Y direction, crosses the lower cell array CAR_L along Y direction, and has connected to it a predetermined number (e.g., 256) of memory cells MC.

An upper/lower selection signal A is applied to the control terminal of the upper switch US, and is inverted by an inverter IV and then applied to the control terminal of the lower switch LS. Thus, the upper and lower switches US and LS are controlled complementarily. That is, when the upper switch US is on, the lower switch LS is off; when the upper switch US is off, the lower switch LS is on.

For example, as shown in FIG. 11, when the upper switch US is on and the lower switch LS is off, the upper bit line BL_U (hence the upper cell array CAR_U) is selected and the lower bit line BL_L (hence the lower cell array CAR_L) is left unselected. In this state, the sense amplifier SA pre-charges the upper bit line BL_U and, according to whether a current passes in the read-target memory cell MC corresponding to the selected word line WL, data is read.

In the example in FIG. 11, data "1" is written in the read-target memory cell MC (with the selection transistor on), and no current passes in the read-target memory cell MC. On the other hand, in a memory cell MC (with the selection transistor off) other than the read-target memory cell MC connected to the upper bit line BL_U, a leak current IL may pass at high temperature. However, owing to the memory cell being divided into an upper and a lower part, the upper and lower bit lines each have a reduced number of memory cells MC connected to it, and this helps reduce the leak current. It is thus possible to prevent a leak current from causing "0" to be erroneously read from the read-target memory cell MC.

However, the second comparative example configured as described above requires two bit lines to be laid across the upper cell array CAR_U, and miniaturizing the memory device may leave no space for bit lines.

4. Third Comparative Example

Figure 12:
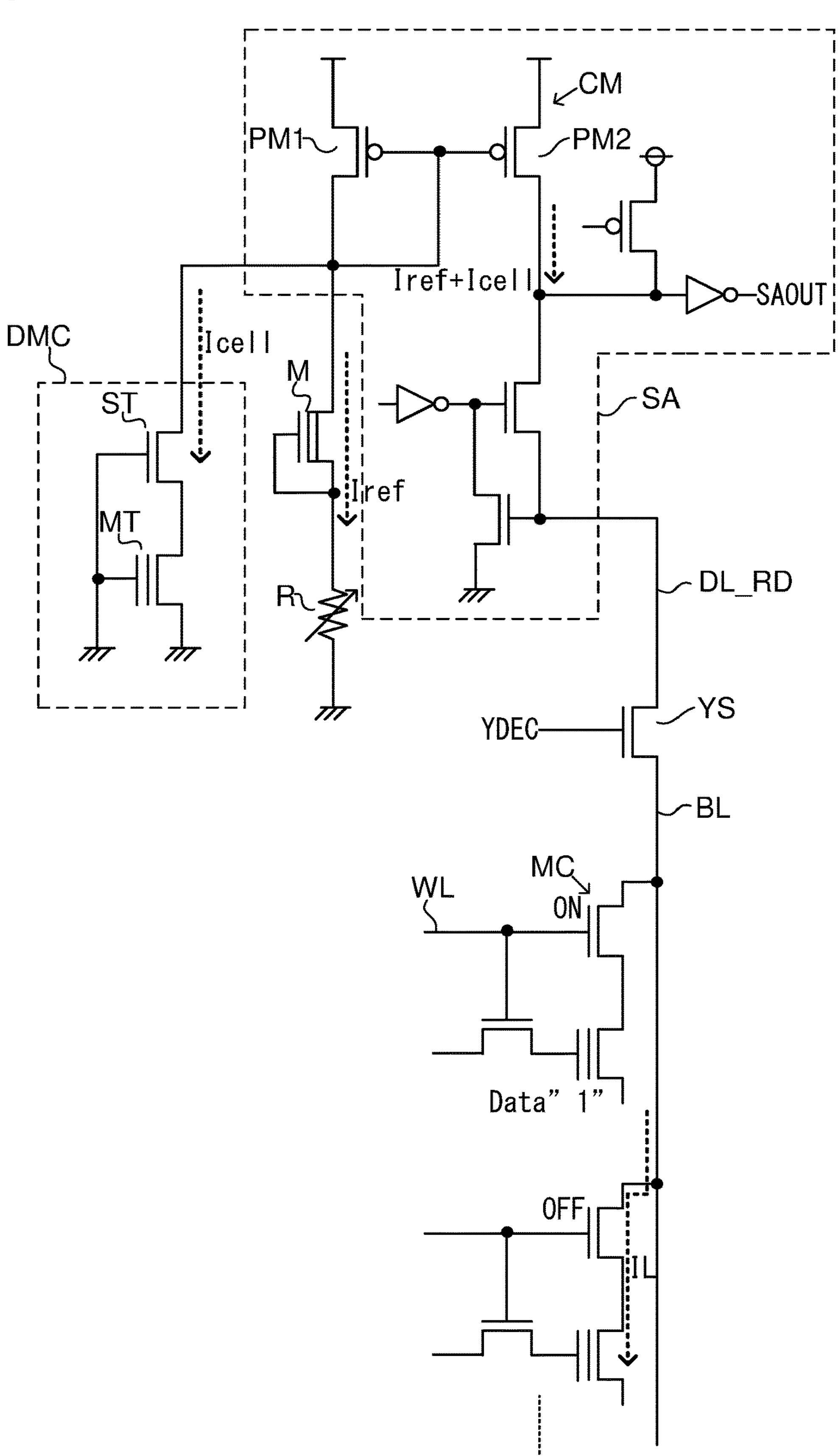
FIG. 12 is a diagram showing the configuration related to data reading in a memory device of a third comparative example.

FIG. 12 is a diagram showing the configuration related to data reading in a memory device of a third comparative example. The third comparative example is implemented to solve the second problem mentioned above (i.e., the influence of an increased leak current).

The configuration shown in FIG. 12 includes a depression NMOS transistor (N-channel MOSFET [metal-oxide-semiconductor field-effect transistor]) M and a variable resistor R. The gate and the source of the NMOS transistor M are short-circuited together. One end of the variable resistor R is connected to the source of the NMOS transistor M. The other end of the variable resistor R is connected to an application terminal for a ground potential.

The configuration shown in FIG. 12 also includes a dummy cell DMC. The gate of a selection transistor ST in the dummy cell DMC and the control gate of a memory transistor MT in the dummy cell DMC are connected to the application terminal for the ground potential.

The dummy cell DMC and the drain of the NMOS transistor M are connected to the drain of an input-side PMOS transistor (P-channel MOSFET) PM1 in a current minor CM.

A current that is the sum of a reference current Iref passing in the NMOS transistor M and a leak current Icell passing in the dummy cell DMC at high temperature is mirrored by the current mirror CM to be output from an output-side MOS transistor PM2 in the current mirror CM. The current mirror CM is used as a current source for the sense amplifier SA provided in the configuration in FIG. 12.

Figure 13:
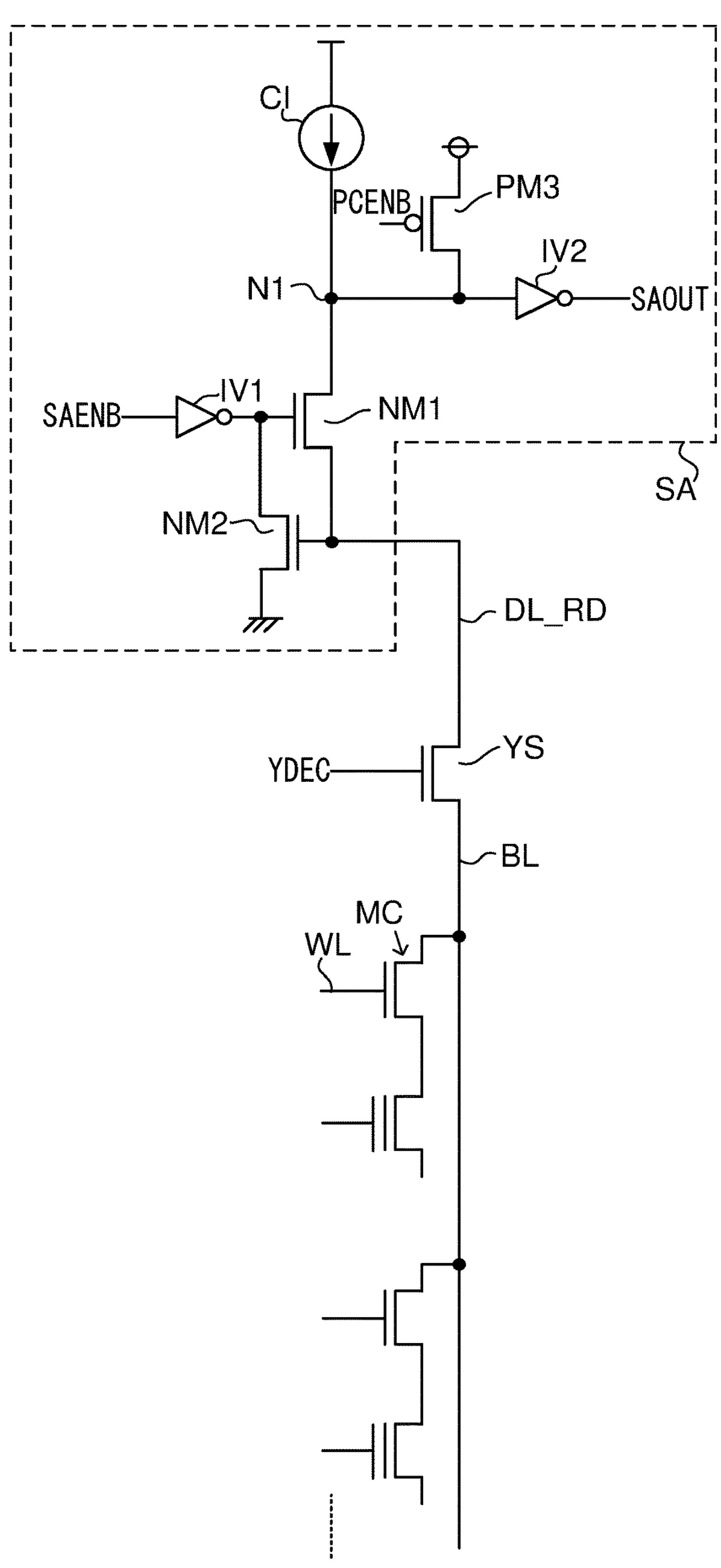
FIG. 13 is a diagram showing a configuration example of a sense amplifier.

Now, with reference to FIG. 13, the sense amplifier SA will be described specifically. As shown in FIG. 13, the sense amplifier SA includes a constant current source CI, an NMOS transistor NM1, an NMOS transistor NM2, an inverter IV1, a PMOS transistor PM3, and an inverter IV2.

The drain of the NMOS transistor NM1 is connected, at a node N1, to the drain of the PMOS transistor PM3. The source of the PMOS transistor PM3 is connected to an application terminal for a supply voltage. The source of the NMOS transistor NM1 is connected to the gate of the NMOS transistor NM2. The drain of the NMOS transistor NM2 is connected to the output terminal of the inverter IV1 and to the gate of the NMOS transistor NM1. The source of the NMOS transistor NM2 is connected to the application terminal for the ground potential. The node N1 is connected to the input terminal of the inverter IV2.

The constant current source CI is connected to the node N1 to supply it with a current for data sensing. The constant current source CI is configured as, for example, a current mirror.

The source of the NMOS transistor NM1 is connected to one end of a read data line DL_RD. The other end of the read data line DL_RD is connected via a Y line selection switch YS to one end of a bit line BL. The bit line BL has a predetermined number of memory cells MC connected to it.

Figure 14:
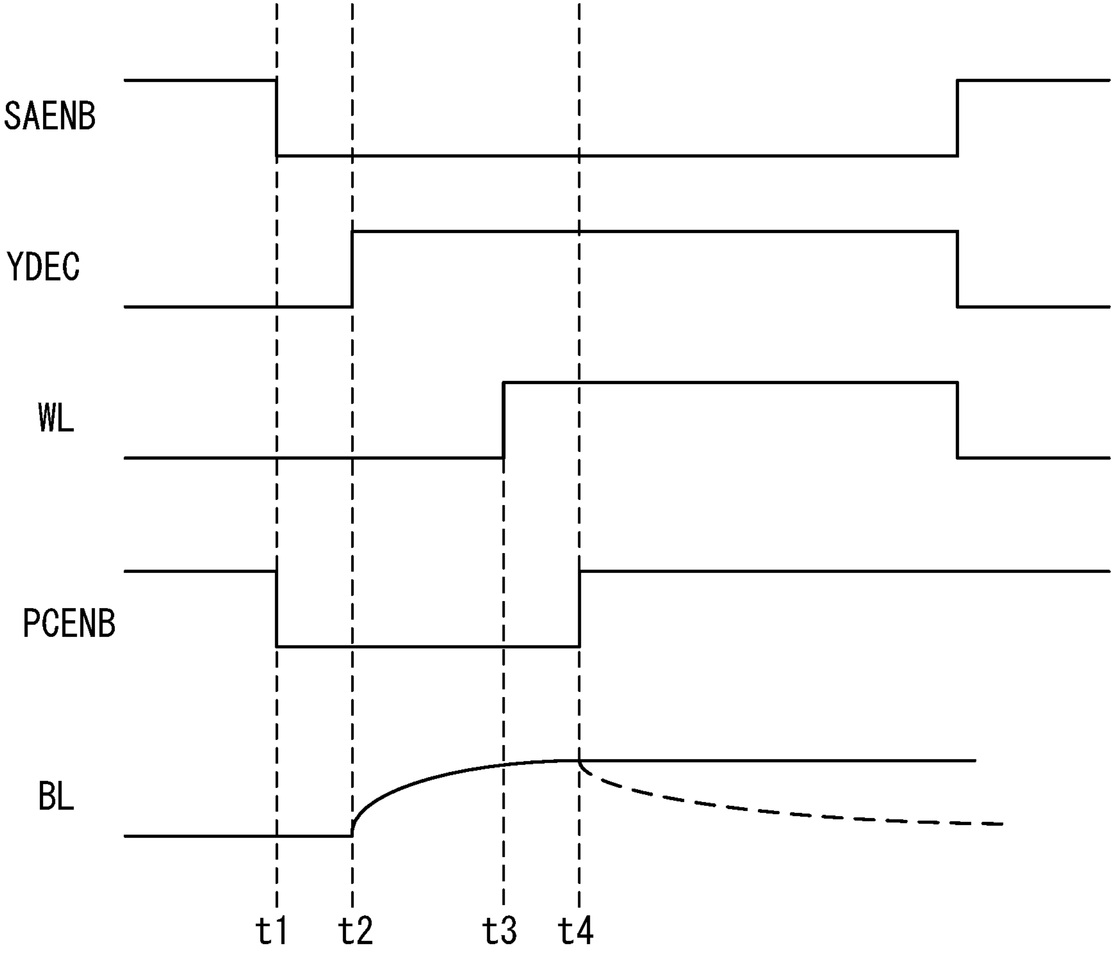
FIG. 14 is a timing chart showing an example of the operation of a sense amplifier.

The operation of the sense amplifier SA will now be described with reference to the timing chart FIG. 14. FIG. 14 shows an example of the waveforms of, from top down, a sense amplifier enable signal SAENB fed to the inverter IV1, a Y line selection signal YDEC, the voltage on a word line WL, a pre-charge enable signal PCENB fed to the gate of the PMOS transistor PM3, and the voltage on a bit line BL.

First, at time t1, the sense amplifier enable signal SAENB and the pre-charge enable signal PCENB are both switched from high level to low level. Thus, the read data line DL_RD starts to be pre-charged.

Then, when at time t2 the Y line selection signal YDEC is switched from low level to high level, the Y line selection switch YS is turned on and the bit line BL is selected. Now the bit line BL starts to be pre-charged and the voltage on the bit line BL rises.

Then, at time t3, the voltage on the word line WL corresponding to the read-target memory cell MC is switched from low level to high level.

Then, when at time t4 the pre-charge enable signal PCENB is switched from low level to high level, the PMOS transistor PM3 is turned off and a sense operation is started. If "1" is written in the read-target memory cell MC, no current passes in that memory cell MC and thus the voltage on the bit line BL does not drop (solid line in FIG. 14). Accordingly, a sense amplifier output signal SAOUT output from the inverter IV2 is kept at a low level.

By contrast, if "0" is written in the read-target memory cell MC, a current passes in that memory cell MC. The current that passes in that memory cell is higher than the current supplied from the constant current source CI, and thus the voltage on the bit line BL drops (broken line in FIG. 14). This tiny voltage change on the bit line BL (read data line DL_RD) is amplified by the circuit composed of the NMOS transistors NM1 and NM2 and is then fed to the node N1. Thus, the sense amplifier output signal SAOUT is switched from low level to high level.

In the configuration of the third comparative example (FIG. 12), as a current source for the sense amplifier SA, the current mirror CM is provided, and this current source supplies the sum current of the reference current Tref and the leak current Icell.

Thus, as shown in FIG. 12, for example, if data "1" is written in the read-target memory cell MC, even if a leak current IL passes in a memory cell MC that is not a read target, in a sense operation the leak current IL is canceled out by the leak current Icell in the dummy cell DMC, and this prevents the voltage on the bit line BL from dropping. It is thus possible to prevent "0" from being erroneously read from the read-target memory cell MC.

Inconveniently, the third comparative example configured as described above requires an increased current to be supplied in a sense operation, and this may reduce the sense speed at which "0" is read from the read-target memory cell MC.

5. Embodiment of the Present Disclosure

Figure 1:
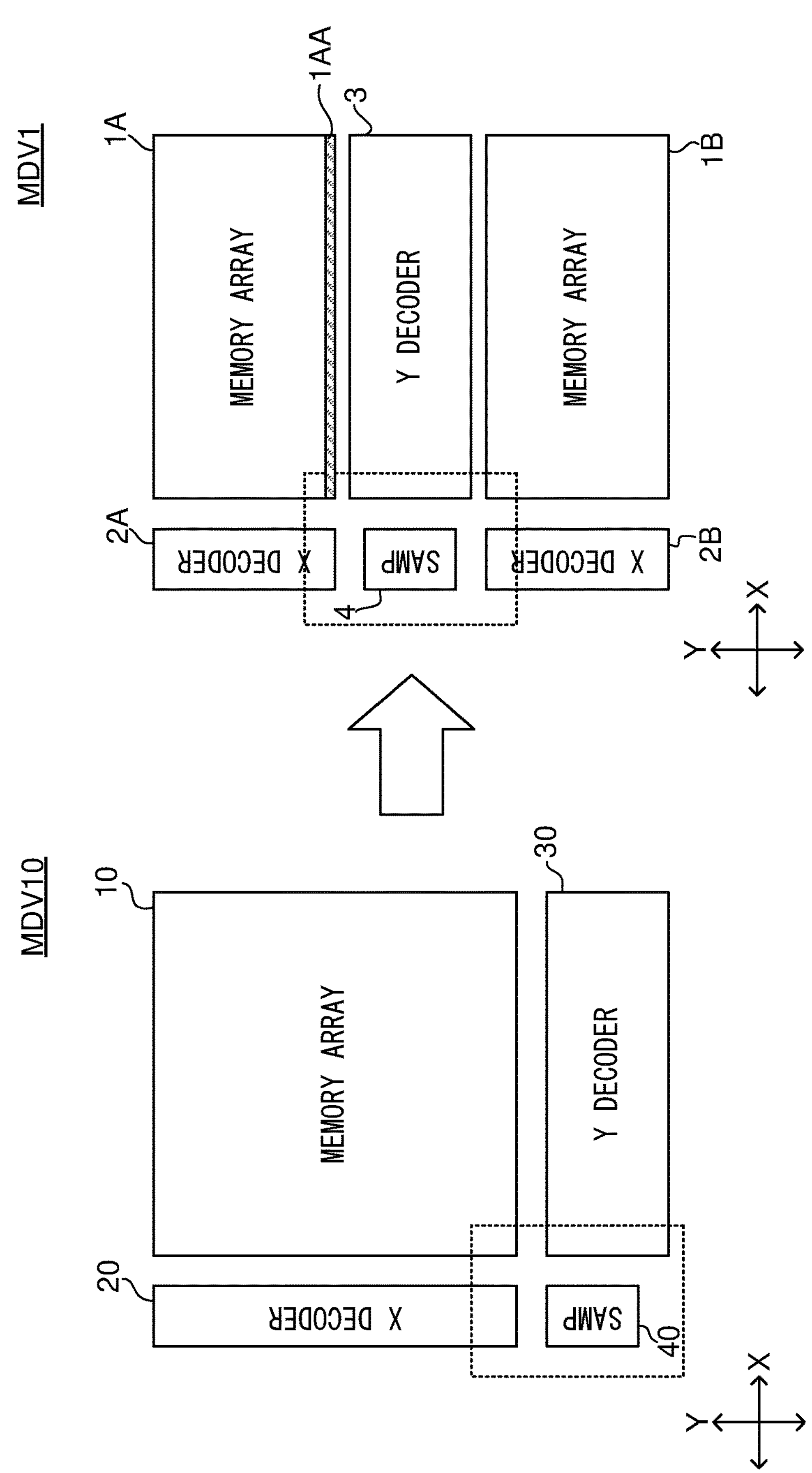
FIG. 1 shows schematic layout diagrams of an unimproved memory device and an improved memory device according to an embodiment of the present disclosure.

On the basis of what has been discussed above, an embodiment of the present disclosure will be described. FIG. 1 shows, at left, a schematic layout diagram of an unimproved memory device MDV10 and, at right, a schematic layout diagram of an improved memory device MDV1 according to an embodiment of the present disclosure. In FIG. 1, mutually orthogonal directions, X and Y directions, are indicated. FIG. 1 is a plan view as seen from a direction perpendicular to both X and Y directions.

As shown in FIG. 1, at left, the unimproved memory device MDV10 includes a memory array 10, an X decoder 20, a Y decoder 30, and a sense amplifier region 40. By contrast, the improved memory device MDV1 includes an upper memory array 1A, a lower memory array 1B, an upper X decoder 2A, a lower X decoder 2B, a Y decoder 3, and a sense amplifier region 4.

That is, in the embodiment of the present disclosure, a memory array is divided into two banks. The upper memory array 1A (bank A) and the lower memory array 1B (bank B) are disposed beside each other along Y direction. The Y decoder 3 is disposed at one side of the lower memory array 1B along Y direction, at the other side of the upper memory array 1A along Y direction. That is, the Y decoder 3 is disposed so as to be located between the upper and lower memory arrays 1A and 1B along Y direction. Suppose that, in the unimproved memory device MDV10, the memory array 10 has a capacity of 1 Mbit; then, to maintain the capacity of the memory device, in the improved memory device MDV1, the upper and lower memory arrays 1A and 1B can be given, if they are to have equal capacities, a capacity of 512 Kbit each.

The upper X decoder 2A is disposed adjacent to the upper memory array 1A, at its one side along X direction, and the lower X decoder 2B is disposed adjacent to the lower memory array 1B, at its one side along X direction. The sense amplifier region 4 is disposed so as to be located between the upper and lower X decoders 2A and 2B along Y direction, and is disposed adjacent to the Y decoder 3, at its one side along X direction.

Figure 2A:
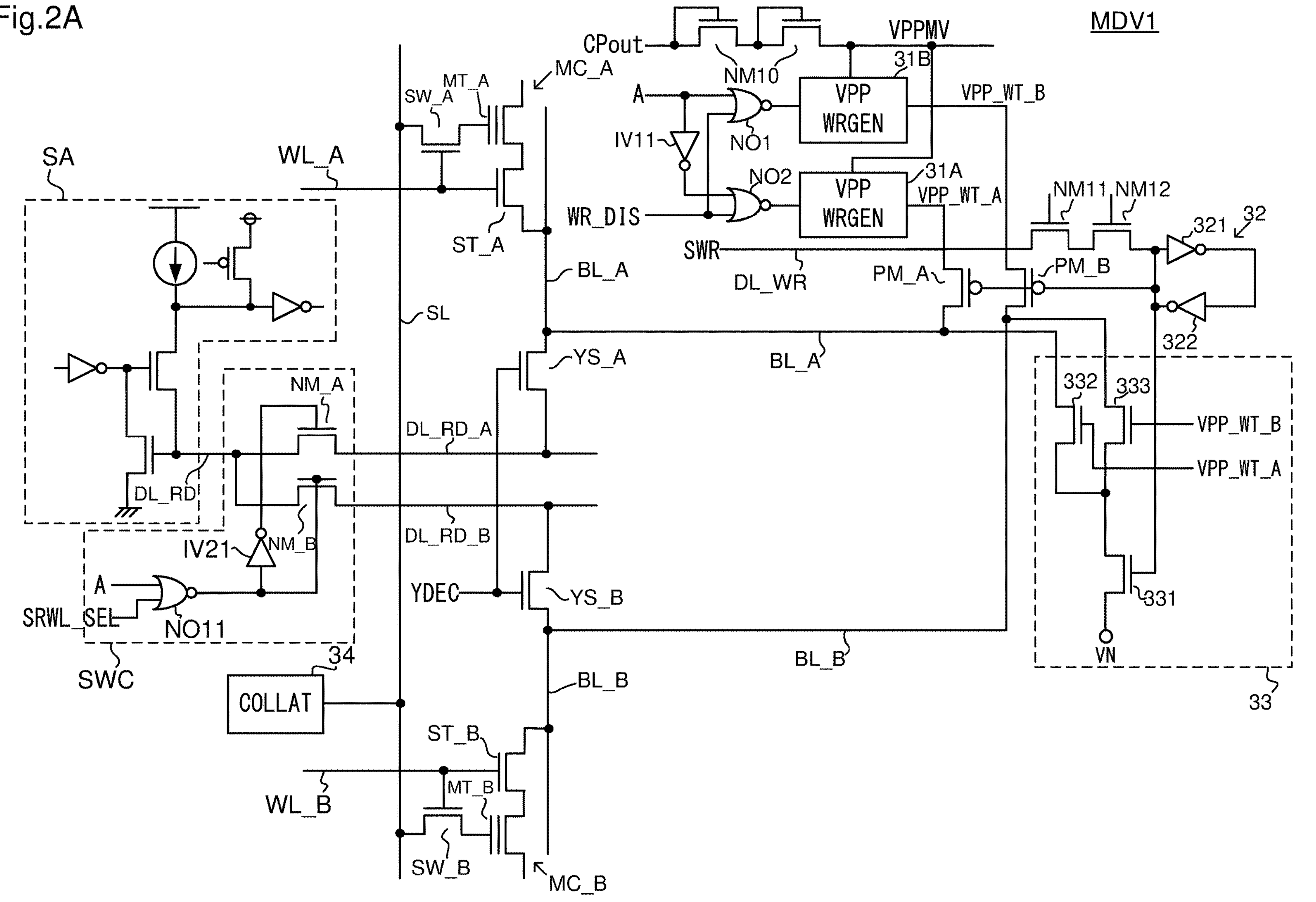
FIG. 2A is a circuit diagram showing the configuration of part of the memory device according to the embodiment of the present disclosure.

FIG. 2A is a circuit diagram showing the configuration of part of the memory device MDV1 according to the embodiment of the present disclosure.

In the memory device MDV1, a bit line extending along Y direction is separated into two paths, specifically an upper bit line BL_A and a lower bit line BL_B. The upper bit line BL_A crosses the upper memory array 1A. Each upper bit line BL_A has connected to it a predetermined number (e.g., 256) of memory cells MC_A. The lower bit line BL_B crosses the lower memory array 1B. Each lower bit line BL_B has connected to it a predetermined number (e.g., 256) of memory cells MC_B.

In each of the upper and lower memory arrays 1A and 1B, as a unit by which reading (data read) and writing (data write) are performed, memory cells corresponding to a predetermined number of bits constitute a cell unit. The just-mentioned predetermined number of bits is, for example, 38 bits. A number of memory cells MC_A and MC_B corresponding to the above-mentioned predetermined number of bits are arrayed along X direction to constitute the cell unit.

A word line WL_A extending from the upper X decoder 2A along X direction crosses the upper memory array 1A. Each word line WL_A is connected to the control terminals (read gates) of selection transistors ST_A arrayed in a row along X direction.

A word line WL_B extending from the lower X decoder 2B along X direction crosses the lower memory array 1B. Each word line WL_B is connected to the control terminals (read gates) of selection transistors ST_B arrayed in a row along X direction.

A selection line SL extending along Y direction crosses the upper and lower memory arrays 1A and 1B. Each selection line SL is connected to the first terminals of selection switches SW_A and SW_B arrayed in a row along Y direction. The second terminal of each of the selection switches SW_A and SW_B is connected to the control gates of a number of memory transistors MT_A and MT_B corresponding to the above-mentioned predetermined number of bits that are arrayed in a row along X direction. The control terminals of the selection switches SW_A and SW_B are connected to the word lines WL_A and WL_B.

The upper and lower Y line selection switches YS_A and YS_B are provided in the Y decoder 3. The first terminal of the upper Y line selection switch YS_A is connected to the upper bit line BL_A. The second terminal of the upper Y line selection switch YS_A is connected to an upper read data line DL_RD_A. The first terminal of the lower Y line selection switch YS_B is connected to the lower bit line BL_B. The second terminal of the lower Y line selection switch YS_B is connected to a lower read data line DL_RD_B.

The memory device MDV1 includes a switch circuit SWC. The switch circuit SWC includes an NMOS transistor NM_A, an NMOS transistor NM_B, an inverter IV21, and a NOR circuit NO11.

The first terminal of the NMOS transistor NM_A is connected to one end of the upper read data line DL_RD_A. The first terminal of the NMOS transistor NM_B is connected to one end of the lower read data line DL_RD_B. The second terminals of the NMOS transistors NM_A and NM_B are connected via a read data line DL_RD to the sense amplifier SA. The gate of the NMOS transistor NM_A is connected to the output terminal of the inverter IV21. The gate of the NMOS transistor NM_B and the input terminal of the inverter IV21 are connected to the output terminal of the NOR circuit NO11.

One input terminal of the NOR circuit NO11 is fed with an upper/lower selection signal A. The other input terminal of the NOR circuit NO11 is fed with a selection signal SRWL_SEL. When the selection signal SRWL_SEL is at low level, the input of the upper/lower selection signal A is valid. In this condition, when the upper/lower selection signal A is at high level, the gate voltage of the NMOS transistor NM_A is at high level and the gate voltage of the NMOS transistor NM_B is at low level, so that the NMOS transistor NM_A is on and the NMOS transistor NM_B is off. In this state, the sense amplifier SA and the upper read data line DL_RD_A conduct to each other.

By contrast, when the upper/lower selection signal A is at a low level, the gate voltage of the NMOS transistor NM_A is at a low level and the gate voltage of the NMOS transistor NM_B is at a high level, so that the NMOS transistor NM_A is off and the NMOS transistor NM_B is on. In this state, the sense amplifier SA and the lower read data line DL_RD_B conduct to each other.

As described above, the switch circuit SWC chooses either the upper read data line DL_RD_A or the lower read data line DL_RD_B based on the upper/lower selection signal A.

Note that the selection signal SRWL_SEL is a signal for access to a memory region 1AA that is included in the upper memory array 1A but that is special and separate from the ordinary one. The memory region 1AA stores, for example, device identification data (such as manufacturer code), trimming data for analog value correction, and history information at shipment. When access is made to the memory region 1AA, the selection signal SRWL_SEL is kept at high level, so that the NMOS transistor NM_A is on and the upper read data line DL_RD_A is chosen.

The upper and lower Y line selection switches YS_A and YS_B are switched between on and off by the Y line selection signal YDEC, which is the decoded version of the Y-direction address signal.

In data reading, when the switch circuit SWC chooses the upper read data line DL_RD_A and the Y line selection signal YDEC keeps the upper Y line selection switch YS_A on, the sense amplifier SA can pre-charge the upper read data line DL_RD_A and the upper bit line BL_A; in a sense operation after pre-charging, according to whether a current passes in the read-target memory cell MC_A in the upper memory array 1A, data is read.

On the other hand, when the switch circuit SWC chooses the lower read data line DL_RD_B and the Y line selection signal YDEC keeps the lower Y line selection switch YS_B on, the sense amplifier SA can pre-charge the lower read data line DL_RD_B and the lower bit line BL_B; in a sense operation after pre-charging, according to whether a current passes in the read-target memory cell MC_B in the lower memory array 1B, data is read.

Figure 2B:
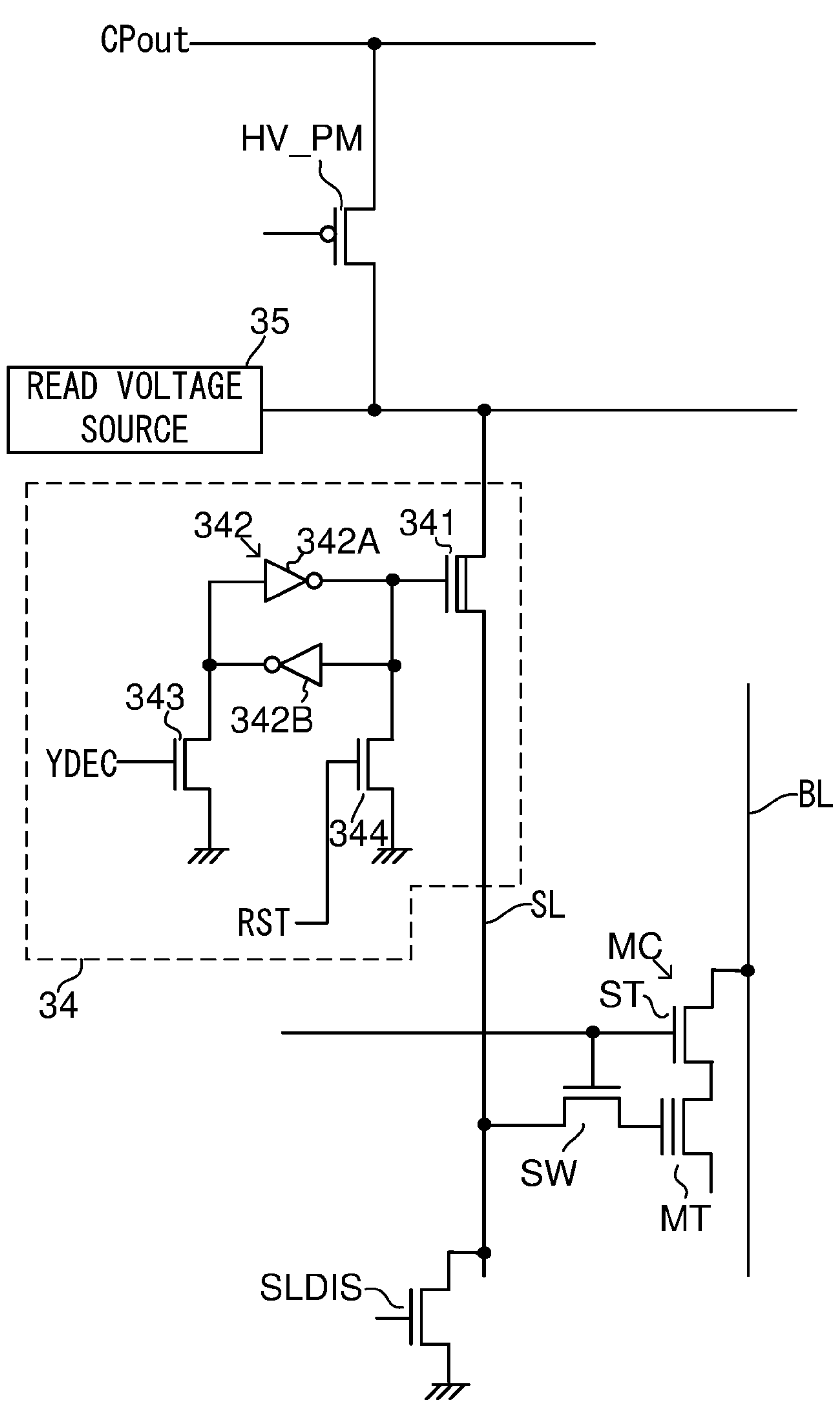
FIG. 2B is a diagram showing the circuit configuration of a column latch circuit.

The memory device MDV1 includes a column latch circuit 34. FIG. 2B shows the circuit configuration of the column latch circuit 34. The column latch circuit 34 includes a depression NMOS transistor 341, a latch circuit 342, and switches 343 and 344. The drain of the NMOS transistors 341 is connected to the drain of a PMOS transistor HV_PM. The source of the PMOS transistor HV_PM is connected to an application terminal for a charge pump output voltage CPout output from an unillustrated charge pump. The drain of the NMOS transistors 341 is connected to the output terminal of a read voltage source 35. The latch circuit 342 includes inverters 342A and 342B. The output terminal of the inverter 342A is connected to the gate of the NMOS transistors 341. The input terminal of the inverter 342B is connected to the output terminal of the inverter 342A. The output terminal of the inverter 342B is connected to the input terminal of the inverter 342A. The first terminal of the switch 343 is connected to the output terminal of the inverter 342B. The second terminal of the switch 343 is connected to an application terminal for the ground potential. The first terminal of the switch 344 is connected to the gate of the NMOS transistors 341. The second terminal of the switch 344 is connected to the application terminal for the ground potential. The switch 343 is switched between on and off by the Y line selection signal YDEC. The switch 344 is switched between on and off by a reset signal RST.

In data reading, the switch 343 is on and the switch 344 is off and thus the output of the latch circuit 342 (i.e., the gate voltage of the NMOS transistors 341) is at high level, so that the NMOS transistors 341 is on. In this condition, the PMOS transistor HV_PM is off, and the read voltage source 35 outputs a predetermined voltage (e.g., 1.4 V) for reading. Thus, the just-mentioned predetermined voltage is applied to a selection line SL. That is, by applying, with the column latch circuit 34, a predetermined voltage (e.g., 1.4 V) for reading to a selection line SL, it is possible to select a column. With word lines WL_A and WL_B and a selection line SL, it is possible to select a read-target cell unit.

A number (e.g., 38) of sense amplifiers SA corresponding to the number of bits in the above-mentioned cell unit are disposed in the sense amplifier region 4. Accordingly, there are provided a number (e.g., 38) of each of read data lines DL_RD, upper read data lines DL_RD_A, and lower read data lines DL_RD_B corresponding to the above-mentioned number of bits. In each cell unit mentioned above, there are provided the above-mentioned number of each of upper bit lines BL_A, upper Y line selection switches YS_A, lower bit lines BL_B, and lower Y line selection switches YS_B. This permits the reading of data with the above-mentioned number of bits in the cell unit mentioned above.

Next, the configuration related to data writing in the memory device MDV1 will be described. In the memory device MDV1, the Y decoder 3 includes an NMOS transistor NM11, an NMOS transistor NM12, a data latch circuit 32, a PMOS transistor PM_A, and a PMOS transistor PM_B.

One end of a write data line DL_WR is connected to the first terminal of the NMOS transistor NM11. The second terminal of the NMOS transistor NM11 is connected to the first terminal of the NMOS transistor NM12. The data latch circuit 32 includes inverters 321 and 322. The input terminal of the inverter 321 and the output terminal of the inverter 322 are connected together, and the output terminal of the inverter 321 and the input terminal of the inverter 322 is connected together. The second terminal of the NMOS transistor NM12 is connected to the data latch circuit 32.

Figure 3:
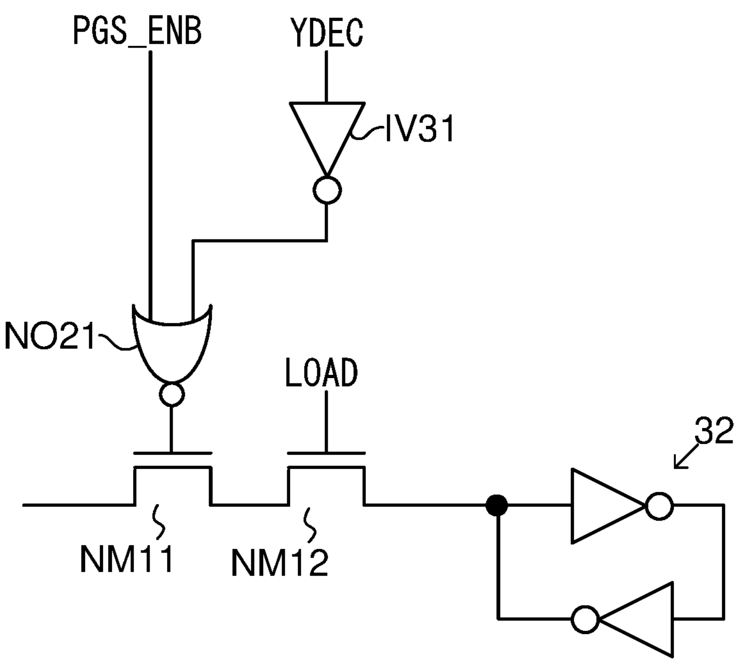
FIG. 3 is a diagram showing the configuration related to the signals fed to the gates of NMOS transistors NM11 and NM12.

FIG. 3 shows the configuration related to the signals fed to the gates of the NMOS transistors NM11 and NM12. To the gate of the NMOS transistor NM11 is connected the output terminal of a NOR circuit NO21. One input terminal of the NOR circuit NO21 is fed with a page set enable signal PGS_ENB. To the other input terminal of the NOR circuit NO21 is connected the output terminal of an inverter IV31. The input terminal of the inverter IV31 is fed with the Y line selection signal YDEC. The gate of the NMOS transistor NM12 is fed with a load signal LOAD.

Thus, when the page set enable signal PGS_ENB is at low level, the Y line selection signal YDEC is at high level, and the load signal LOAD is at high level, the NMOS transistors NM11 and NM12 are both on. In this state, a write data signal SWR (FIG. 2A) fed to the write data line DL_WR is applied to the data latch circuit 32, and thus the data of the write data signal SWR is set. Even when the NMOS transistor NM11 switches off, the data latch circuit 32 latches the data.

The data latch circuit 32 is connected to the gates of the PMOS transistors PM_A and PM_B. When low-level data is latched, the PMOS transistors PM_A and PM_B are on; when high-level data is latched, the PMOS transistors PM_A and PM_B are off.

The memory device MDV1 includes high-voltage pulse generators 31A and 31B, NOR circuits NO1 and NO2, and an inverter IV11. The high-voltage pulse generators 31A and 31B are circuits that output high-voltage pulses in a write operation, which will be described later. The output terminal of the high-voltage pulse generator 31A is connected to the first terminal of the PMOS transistor PM_A, and the output terminal of the high-voltage pulse generator 31B is connected to the first terminal of the PMOS transistor PM_B.

A charge pump output voltage CPout output from an unillustrated charge pump is bucked (stepped down) by a two-stage NMOS transistor NM10 into a bucked voltage VPPMV. The bucked voltage VPPMV is supplied to the high-voltage pulse generators 31A and 31B.

The output terminal of the NOR circuit NO1 is connected to the high-voltage pulse generator 31B. The output terminal of the NOR circuit NO2 is connected to the high-voltage pulse generator 31A. The upper/lower selection signal A is on one hand fed to one input terminal of the NOR circuit NO1, and is on the other hand inverted by the inverter IV11 and then fed to one input terminal of the NOR circuit NO2. A write discharge signal WR_DIS is fed to the other input terminals of the NOR circuits NO1 and NO2.

When the write discharge signal WR_DIS is at low level, the input of the upper/lower selection signal A is valid so that, according to the level of the upper/lower selection signal A, which of the high-voltage pulse generators 31A and 31B to operate can be chosen. Specifically, according to the upper/lower selection signal A, a write operation for either the upper or lower memory array 1A or 1B can be chosen. When the write discharge signal WR_DIS turns to high level, whichever of the high-voltage pulse generators 31A and 31B has operated can, after generating a high voltage, output 0 V to discharge whichever of the bit lines BL_A and BL_B has the high voltage applied to it.

Figure 4:
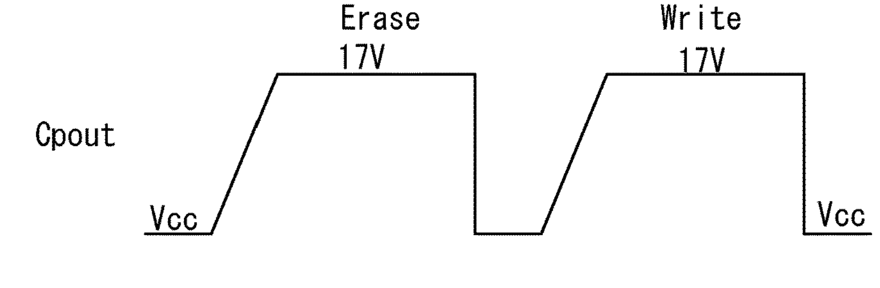
FIG. 4 is a timing chart schematically showing the waveforms of relevant signal in data writing.
Figure 4:
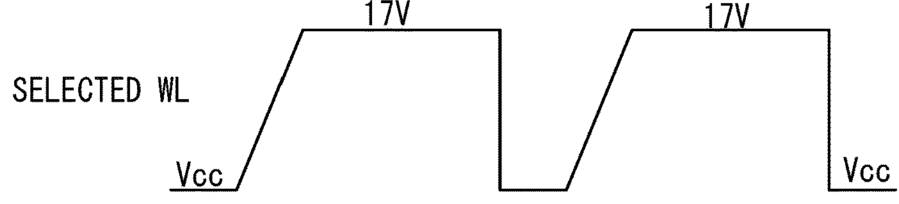
Figure 4:
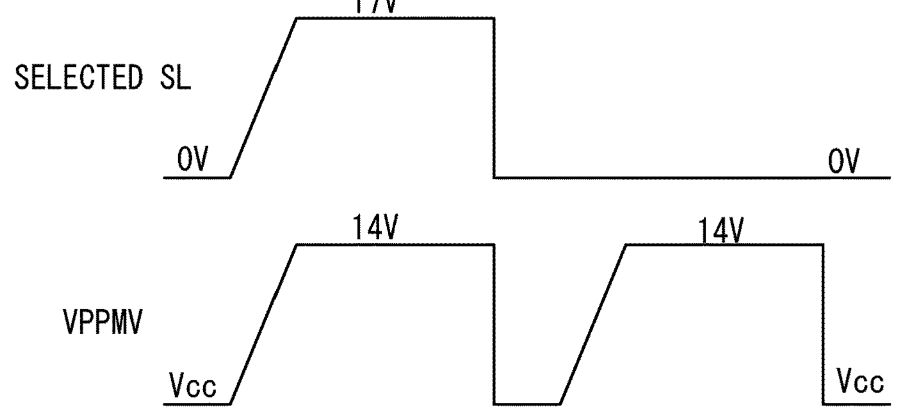
Figure 4:
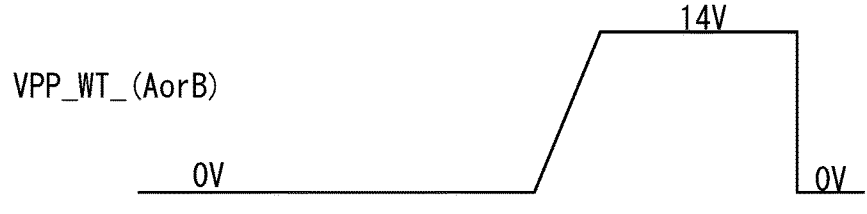
Figure 4:
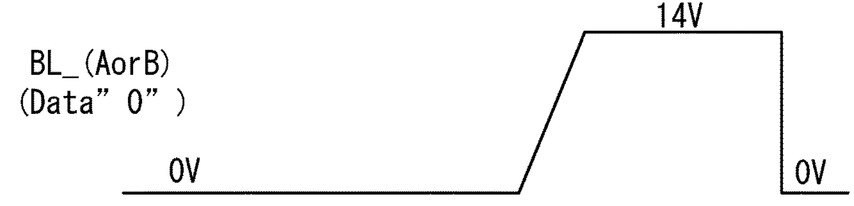
Figure 4:

FIG. 4 is a timing chart schematically showing the waveforms of relevant signals in data writing. FIG. 4 depicts, from top tier down, the charge pump output voltage CPout, the voltage on the selected word line WL, the voltage on the selected selection line SL, the bucked voltage VPPMV, the high-voltage output voltages VPP_WT_A and VPP_WT_B output from the high-voltage pulse generators 31A and 31B, and the voltages on the bit lines BL_A and BL_B as observed when data "0" is written to a memory cell MC. FIG. 4 assumes as one example that the charge pump generates a high voltage of 17 V.

In data writing, an erase operation and a write operation are performed in sequence. In the erase operation, the charge pump output voltage CPout rises from a supply voltage Vcc up to 17 V. Here, as a result of 3-volt busting from 17 V by the two-stage NMOS transistor NM10, the bucked voltage VPPMV equals 14 V. Whichever of the high-voltage pulse generators 31A and 31B is chosen to operate by the upper/lower selection signal A outputs a high-voltage output voltage VPP_WT_A or VPP_WT_B of 0 V.

Here, the data latch circuit 32 latches low-level data, so that the PMOS transistors PM_A and PM_B are on and the bit lines BL_A and BL_B are fed with 0 V. Moreover, in the column latch circuit 34, the NMOS transistors 341 is on and the PMOS transistor HV_PM is on, so that the selected selection line SL is fed with 17 V. Thus, in the write-target memory cells MC_A and MC_B, the selection transistors ST_A and ST_B are on and the control gates of the memory transistors MT_A and MT_B are fed with a high voltage (here, 17 V). Thus, in the write-target memory cells MC_A and MC_B, electrons are injected to the floating gates of the memory transistors MT_A and MT_B, so that the memory transistors MT_A and MT_B are brought into an erased state.

After the erase operation, in a write operation, the charge pump output voltage CPout again rises from the supply voltage Vcc up to the 17 V. Here, the bucked voltage VPPMV equals 14 V. Whichever of the high-voltage pulse generators 31A and 31B is chosen to operate by the upper/lower selection signal A outputs a high-voltage output voltage VPP_WT_A or VPP_WT_B of 14 V. That is, in the write operation, high-voltage pulses are generated.

Here, when data "0" is written to a write-target memory cell, the data latch circuit 32 latches low-level data; thus the PMOS transistors PM_A and PM_B are on and the bit lines BL_A and BL_B are fed with 14 V. Moreover, a switch SLDIS (FIG. 2B) for keeping the selection line SL at the ground potential is connected to the selection line SL. Thus, in the write-target memory cells MC_A and MC_B, the selection transistors ST_A and ST_B are on and the control gates of the memory transistors MT_A and MT_B are fed with 0 V. Thus, in the write-target memory cells MC_A and MC_B, electrons are extracted from the floating gates of the memory transistors MT_A and MT_B, so that the memory transistors MT_A and MT_B are brought into a written state ("0").

By contrast, when data "1" is written to a write-target memory cell, the data latch circuit 32 latches high-level data; thus the PMOS transistors PM_A and PM_B are off and the bit lines BL_A and BL_B are open. Thus, in the write-target memory cells MC_A and MC_B, no electrons are extracted from the floating gates of the memory transistors MT_A and MT_B and the memory transistors MT_A and MT_B are kept in the erased state ("1").

Moreover, in the memory device MDV1, the Y decoder 3 includes a clamp circuit 33. The clamp circuit 33 includes NMOS transistors 331, 332, and 333. The first terminal of the NMOS transistor 331 is fed with a clamp voltage VN. To the gate of the NMOS transistor 331, the data latch circuit 32 is connected. The second terminal of the NMOS transistor 331 is connected to the first terminals of the NMOS transistors 332 and 333. The second terminal of the NMOS transistor 332 is connected to the second terminal of the PMOS transistor PM_A. The second terminal of the NMOS transistor 333 is connected to the second terminal of the PMOS transistor PM_B.

When data "1" is written to a write-target memory cell, in a write operation, the data latch circuit 32 latches high-level data and the PMOS transistors PM_A and PM_B are off. Here, the NMOS transistor 331 is on and, when the high-voltage output voltages VPP_WT_A and VPP_WT_B become a high voltage (14 V), the NMOS transistors 332 and 333 turn on and the bit lines BL_A and BL_B are fed with the clamp voltage VN. In this way, when the bit line adjacent to the bit lines BL_A and BL_B is fed with a high voltage, the voltages at the bit lines BL_A and BL_B can be clamped at or below the clamp voltage VN, and it is thus possible to prevent a rise in the voltages on the bit lines BL_A and BL_B.

There are provided a number (e.g., 38) of write data lines DL_WR corresponding to the number of bits in the cell unit mentioned above. Moreover, for each cell unit mentioned above, there are provided a number (e.g., 38) of each of NMOS transistors NM11, NMOS transistors NM12, data latch circuits 32, PMOS transistors PM_A and PMA_B, and clamp circuits 33 corresponding to the number of bits mentioned above. In data writing, an erase operation and a write operation are performed with respect to the cell unit mentioned above. When this is done, first the erase operation is performed for all the bits in the cell unit mentioned above and then the write operation is performed for only the desired bits.

Figure 5:
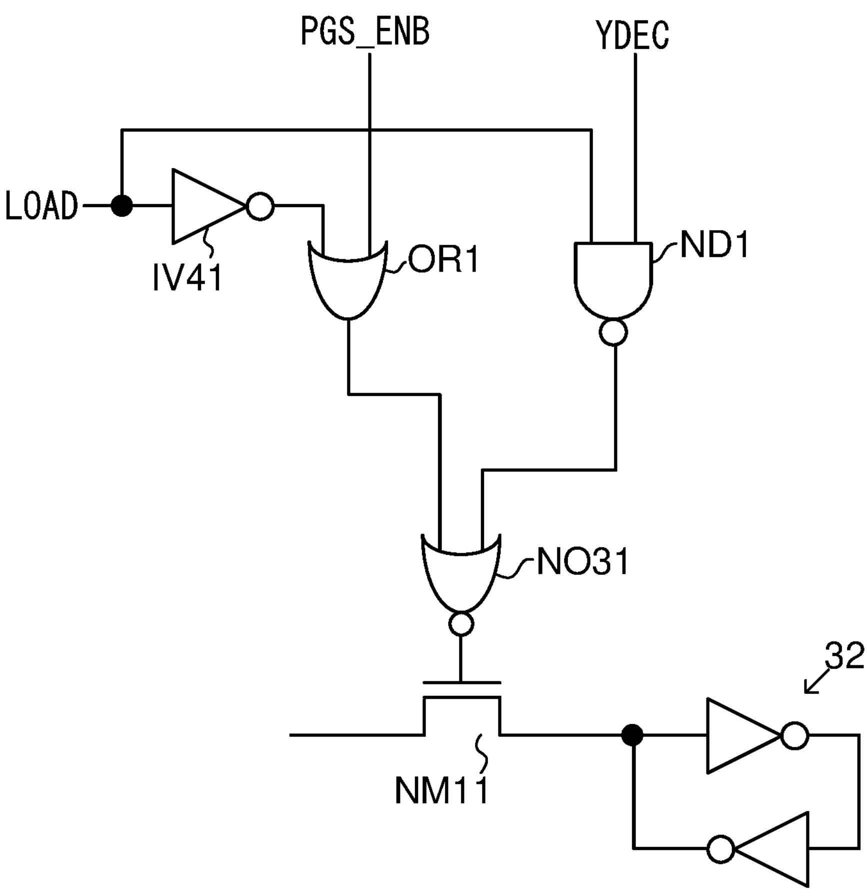
FIG. 5 is a diagram showing a modified example of the configuration in FIG. 3.

Instead of the configuration shown in FIG. 3, where the NMOS transistors NM11 and NM12 are provided in the path for data set, the configuration shown in FIG. 5 may be used. In the configuration shown in FIG. 5, the NMOS transistor NM12 is omitted and only the NMOS transistor NM11 is provided. In this case, to the gate of the NMOS transistor NM11, the output terminal of a NOR circuit NO31 is connected. To one input terminal of the NOR circuit NO31, the output terminal of an OR circuit OR1 is connected. To the other input terminal of the NOR circuit NO31, the output terminal of a NAND circuit ND1 is connected. The LOAD signal is on one hand fed to one input terminal of the NAND circuit ND1, and is on the other hand inverted by an inverter IV41 and then fed to the OR circuit OR1. The page set enable signal PGSET_ENB is fed to the other input terminal of the OR circuit OR1. The Y line selection signal YDEC is fed to the other input terminal of the NAND circuit ND1.

Thus, when the LOAD signal is at high level, the page set enable signal PGSET_ENB is at low level, and the Y line selection signal YDEC is at high level, the gate voltage of the NMOS transistor NM11 is at high level, so that the NMOS transistor NM11 is on and data setting is performed. In this way, consolidating NMOS transistors in the pass for data setting into one helps reduce the number of elements needed.

Figure 6:
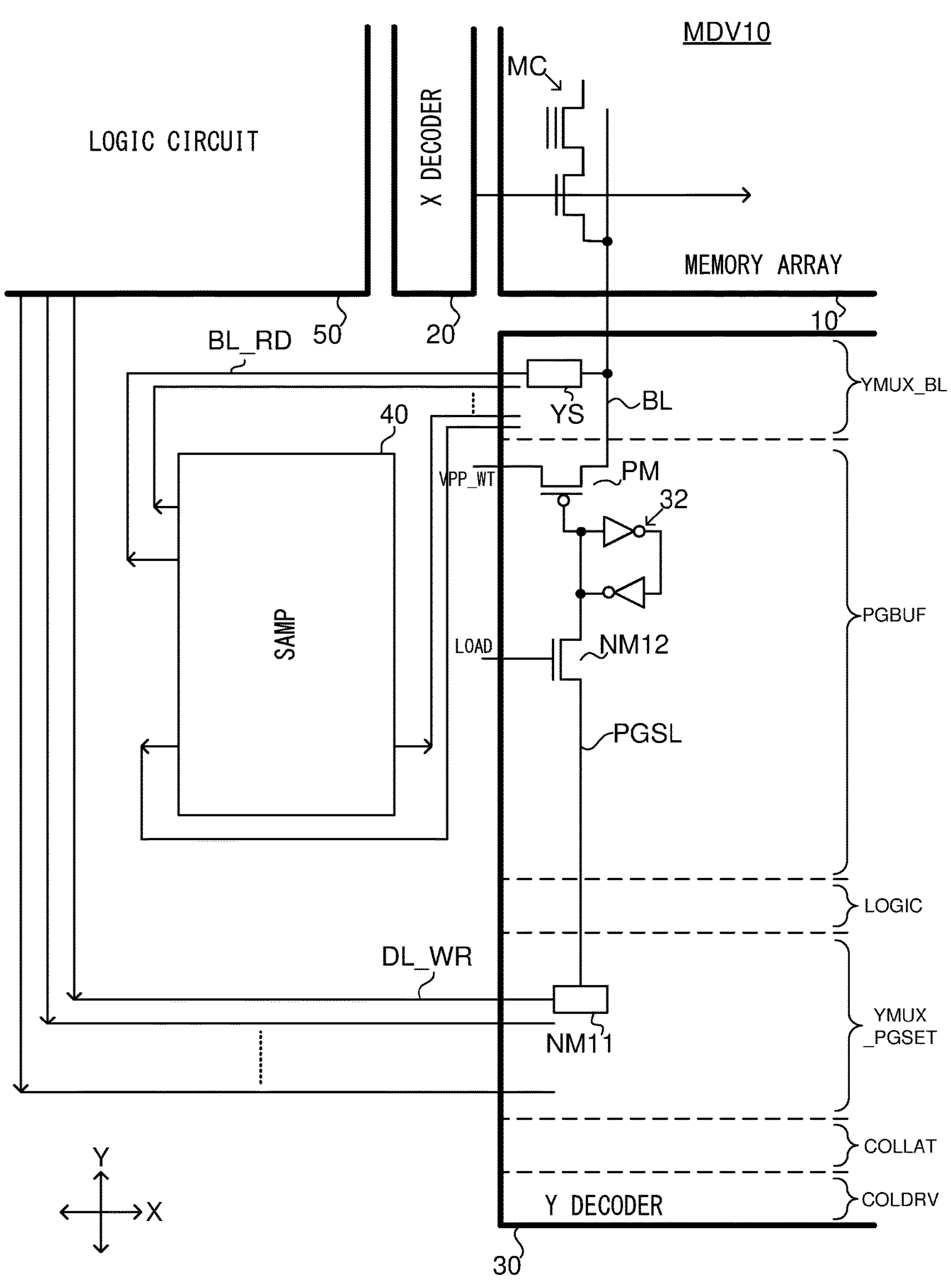
FIG. 6 is an enlarged part view of an unimproved memory device.

FIG. 6 is an enlarged part view of the unimproved memory device MDV10 (an enlarged view of the part enclosed by a broken line in FIG. 1). As shown in FIG. 6, in the Y decoder 30, there are provided, in order from one side to the other along Y direction, a bit line region YMUX_BL, a page buffer region PGBUF, a logic region LOGIC, a page set region YMUX_PGSET, a column latch region COLLAT, and a column drive region COLDRV.

To a bit line BL extending along Y direction, a memory cell MC included in a memory array 10 is connected. A Y line selection switch YS is provided between the bit line BL and a read data line BL_RD and is disposed in the bit line region YMUX_BL.

In a data set path from a logic circuit 50 to a data latch circuit 32 are disposed a write data line DL_WR, an NMOS transistor NM11, and an NMOS transistor NM12. The NMOS transistor NM12, which is driven by the data latch circuit 32, a PMOS transistor PM, and the LOAD signal, is disposed in the page buffer region PGBUF. The PMOS transistor PM is driven by the data latch circuit 32, and is disposed between the bit line BL and an application terminal for a high-voltage output voltage VPP_WT.

The NMOS transistor NM11, which is driven by a page set enable signal and a Y line selection signal, is disposed in the page set region YMUX_PGSET. Between the NMOS transistors NM11 and NM12 is connected a page set line PGSL extending along Y direction. A number (e.g., 38) of such page set lines PGSL corresponding to the number of bits in a cell unit are laid side by side along X direction and because of this, when an attempt is made to divide the memory array 10 into two parts along Y direction, little space to lay bit lines is available at the lower side (at the other side along Y direction).

Moreover, in the page buffer region PGBUF, data latch circuits 32 in a plurality of stages (e.g., four stage) are arrayed along Y direction and because of this still less space to lay bit lines is available at the lower side.

Figure 7:
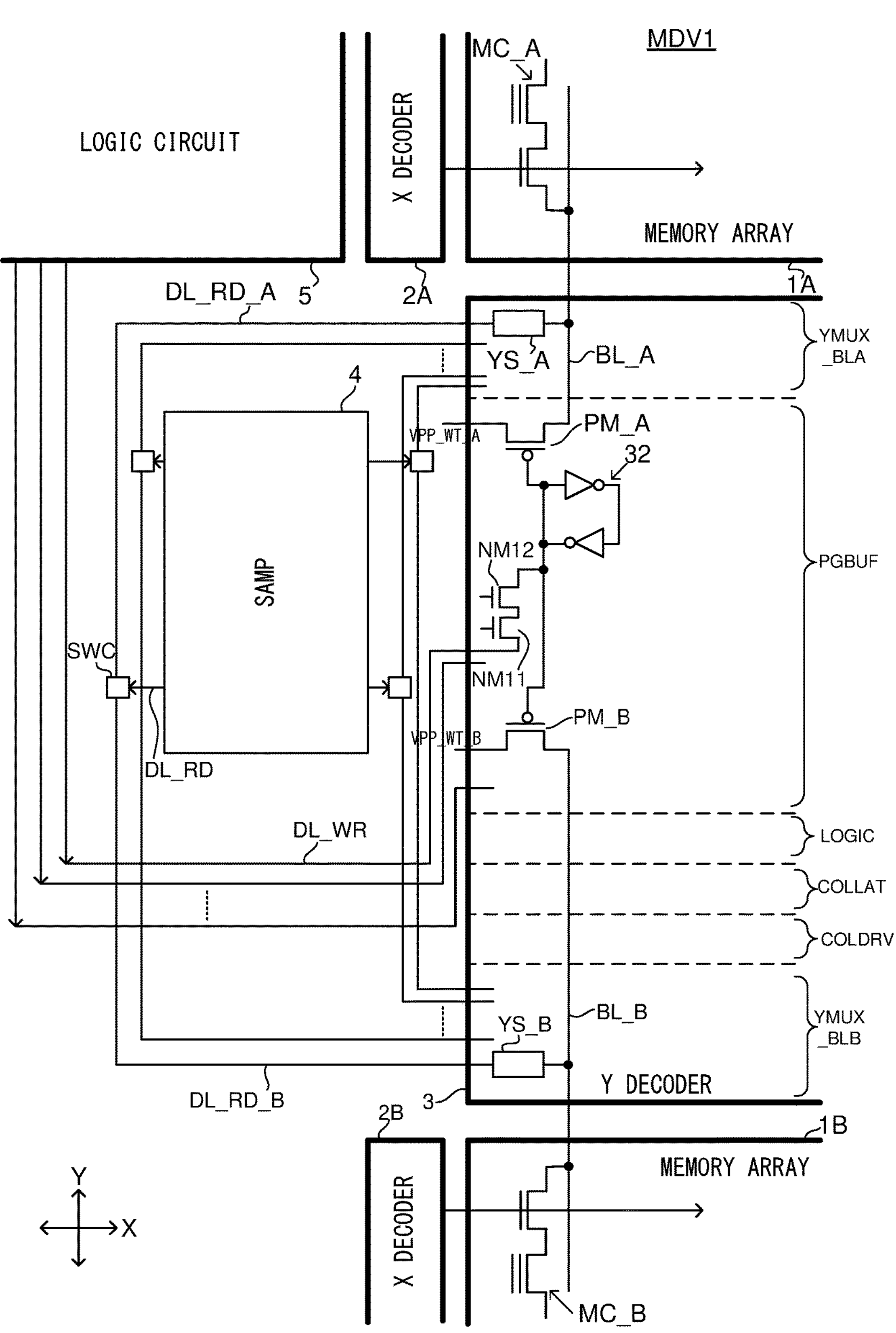
FIG. 7 is an enlarged part view of an improved memory device (according to the embodiment of the present disclosure).

In contrast, FIG. 7 is an enlarged part view of the improved memory device MDV1 (according to the embodiment of the present disclosure) (an enlarged view of the part enclosed by a broken line in FIG. 1). As shown in FIG. 7, in the Y decoder 3, there are provided, in order from one side to the other along Y direction, an upper bit line region YMUX_BLA, a page buffer region PGBUF, a logic region LOGIC, a column latch region COLLAT, a column drive region COLDRV, and a lower bit line region YMUX_BLB.

An upper bit line BL_A extending along Y direction crosses an upper memory array 1A and the upper bit line region YMUX_BLA. An upper Y line selection switch YS_A is provided in the upper bit line region YMUX_BLA. A lower bit line BL_B extending along Y direction crosses a lower memory array 1B and the lower bit line region YMUX_BLB. A lower Y line selection switch YS_B is provided in the lower bit line region YMUX_BLB. The upper and lower Y line selection switches YS_A and YS_B are connected, via an upper read data line DL_RD_A and a lower read data line DL_RD_B respectively, to a switch circuit SWC. The switch circuit SWC is connected via a read data line DL_RD to a sense amplifier SA (disposed in the sense amplifier region 4).

As described above, in the embodiment of the present disclosure, a memory array is divided into an upper and a lower part and bit lines are divided into upper and lower ones. The switch circuit SWC and the upper and lower Y line selection switches permit data reading in two channels. It is thus possible to increase the capacity of the memory device MDV1 while reducing the number of memory cells connected to each of the upper and lower bit lines. This helps reduce leak current at high temperature and suppress data corruption ascribable to leak current. It is thus possible to improve tolerance to data corruption in data reading and to guarantee operation of a high-capacity memory at high temperature (e.g., 150° C.).

Moreover, the upper and lower bit lines each have a smaller wiring length; this helps reduce the to-substrate parasitic capacitance on the bit lines and helps improve the sense speed in data reading. It is thus possible to improve the operating frequency of the memory device MDV1 (e.g., from 10 to 20 MHz).

Owing to the upper and lower bit lines each having a smaller wiring length, the parasitic capacitance between adjacent bit lines is lower. This helps suppress interference between bit lines. Moreover, when the data at a specified address is output, for example when 38-bit data (32 bits plus 6-bit ECC) is read, in this embodiment, it is not necessary to read it in two separate sessions as in the first comparative example described previously; 38-bit data is read simultaneously, and this makes it possible to secure a period in which to read data.

It is not necessary to pass through one memory array bit lines for another memory array as in the second comparative example, and this makes it possible to cope with miniaturization. In this way, with the embodiment of the present disclosure, it is possible to improve data read characteristics while achieving miniaturization and capacity enhancement.

Moreover, in the embodiment of the present disclosure, for data writing, PMOS transistors PM_A and PM_B and high-voltage pulse generators 31A and 31B are provided so that data writing can be performed in two channels. In each of the upper and lower bit lines, the to-substrate capacitance and the leak current can be reduced; it is thus possible to perform desired boosting with a charge pump even with a low supply voltage and to reduce the supply voltage (e.g., from 2.5 to 1.7 V) in a high-capacity memory.

Moreover, in the embodiment of the present disclosure, the NMOS transistor NM12 is disposed adjacent to the data latch circuit 32. In addition, as compared with the unimproved configuration (FIG. 6), the NMOS transistor 11 is disposed adjacent to the NMOS transistor 12 to be integrated in the page buffer region PGBUF, resulting in the page set line PGSL being omitted. This makes it possible to pass the lower bit lines through the Y decoder 3. Also in the embodiment of the present disclosure, as in the unimproved configuration, the data latch circuits 32 in a plurality of stages are disposed along Y direction in the page buffer region PGBUF, but even so a space to pass the lower bit lines BL_B can be secured.

That is, in the unimproved configuration, an attempt to simply divide a memory array into an upper and a lower part necessitates adding a Y decoder for the lower memory array, and this leads to an increase in the chip area. By contrast, the configuration of the present disclosure helps suppress an increase in the chip area. The same is true with the configuration shown in FIG. 5 described previously (where the NMOS transistor NM12 is omitted).

It is preferable that the wiring length from the sense amplifier SA to the upper Y line selection switch YS_A (across the pass via the read data line DL_RD, the switch circuit SWC, and the upper read data line DL_RD_A) be equal to the wiring length from the sense amplifier SA to the lower Y line selection switch YS_B (across the path via the read data line DL_RD, the switch circuit SWC, and the lower read data line DL_RD_B). This helps suppress a difference in the sense speed in data reading between the two, upper and lower, channels.

6. Modifications

The various technical features disclosed herein may be implemented in any manners other than as in the embodiments described above, and allow for many modifications without departure from the spirit of their technical ingenuity. That is, the embodiments described above should be taken to be in every aspect illustrative and not restrictive, and the technical scope of the present invention should be understood to be defined not by the description of the embodiments given above but by the appended claims and encompasses any modifications within a scope and sense equivalent to those claims.

7. Notes

As described above, for example, according to one aspect of the present disclosure, a memory device (MDV1) includes:

an upper memory array (1A) that is configured to have memory cells (MC_A) disposed in a matrix along mutually orthogonal X and Y directions;

a lower memory array (1B) that is configured to have memory cells (MC_B) disposed in a matrix along the X and Y directions and that is disposed at the other side of the upper memory array along the Y direction;

a Y decoder (3) that is configured to be disposed to be located between the upper and lower memory arrays along the Y direction as seen in a plan view;

a sense amplifier (SA); and a switch circuit (SWC).

Upper bit lines (BL_A) connected to the memory cells in the upper memory array extend in the Y direction in the upper memory array and the Y decoder.

Lower bit lines (BL_B) connected to the memory cells in the lower memory array extend in the Y direction in the lower memory array and the Y decoder.

The Y decoder includes:

an upper Y line selection switch (YS_A) that is connected to the upper bit lines; and a lower Y line selection switch (YS_B) that is connected to the lower bit lines and that is disposed at the other side of the upper Y decoder from the upper Y line selection switch along the Y direction.

The switch circuit is configured to be capable of switching so as to permit either conduction between the sense amplifier and the upper Y line selection switch or conduction between the sense amplifier and the lower Y line selection switch. (A first configuration.)

In the first configuration described above, there may be further provided a first high voltage pulse generator (31A) and a second high voltage pulse generator (31B) configured to generate high-voltage pulses in a write operation.

The Y decoder (3) may include:

a data latch circuit (32);

a first transistor (PM_A) having a control terminal driven by data latched by the data latch circuit, a first terminal connected to the output terminal of the first high voltage pulse generator, and a second terminal connected to the upper bit lines (BL_A); and a second transistor (PM_B) having a control terminal driven by the data latched by the data latch circuit, a first terminal connected to the output terminal of the second high voltage pulse generator, and a second terminal connected to the lower bit lines (BL_B). (A second configuration.)

In the second configuration described above, the Y decoder (3) may include a first switch (NM12) and a second switch (NM11) disposed in a path on which data is set by the data latch circuit (32).

The first switch is driven by a load signal (LOAD), and is disposed adjacent to the data latch circuit.

The second switch is driven by a page set enable signal (PGS_ENB) and a Y line select signal (YDEC), and is disposed adjacent to the first switch. (A third configuration.)

In the second configuration described above, the Y decoder (3) may include a third switch (NM11) disposed in a path on which data is set by the data latch circuit (32).

The third switch may be driven by a load signal (LOAD), a page set enable signal (PGS_ENB), and a Y line select signal (YDEC), and may be disposed adjacent to the data latch circuit. (A fourth configuration.)

In any of the second to fourth configurations described above, the Y decoder (3) may include a clamp circuit (33) configured to be capable of applying a clamp voltage (VN) to the upper or lower bit lines (BL_A or BL_B) when, with the first and second transistors (PM_A and PM_B) off, the first or second high voltage pulse generator (31A or 31B) generates a high voltage. (A fifth configuration.)

In any of the first to fifth configurations described above, the wiring length from the sense amplifier (SA) via the switch circuit (SWC) to the upper Y line selection switch (YS_A) may be equal to the wiring length from the sense amplifier via the switch circuit to the lower Y line selection switch (YS_B). (A sixth configuration.)

INDUSTRIAL APPLICABILITY

The present disclosure finds applications in memory devices for a variety of uses.

REFERENCE SIGNS LIST

1A upper memory array
1B lower memory array
2A upper X decoder
2B lower X decoder
3 Y decoder
4 sense amplifier region
5 logic circuit
31A, 31B high-voltage pulse generator
32 data latch circuit
33 clamp circuit
34 column latch circuit
35 read voltage source
BL_A upper bit line
BL_B lower bit line
YS_A upper Y line selection switch
YS_B lower Y line selection switch
DL_RD read data line
DL_RD_A upper read data line
DL_RD_B lower read data line
DL_WR write data line
NM10, NM11, NM12 NMOS transistor
MC_A, MC_B memory cell
MT_A, MT_B memory transistor
PM_A, PM_B PMOS transistor PM ST_A, ST_B selection transistor
SW_A, SW_B selection switch
SA sense amplifier
SWC switch circuit
WL_A, WL_B word line
SL selection line

The invention claimed is:

1. A memory device, comprising:
an upper memory array configured to have memory cells disposed in a matrix along mutually orthogonal X and Y directions;
a lower memory array configured to have memory cells disposed in a matrix along the X and Y directions, the lower memory array being disposed at another side of the upper memory array along the Y direction;
a Y decoder configured to be disposed to be located between the upper and lower memory arrays along the Y direction as seen in a plan view;
a sense amplifier; and
a switch circuit,
wherein
upper bit lines connected to the memory cells in the upper memory array extend in the Y direction in the upper memory array and the Y decoder;
lower bit lines connected to the memory cells in the lower memory array extend in the Y direction in the lower memory array and the Y decoder;
the Y decoder includes:
an upper Y line selection switch connected to the upper bit lines; and
a lower Y line selection switch connected to the lower bit lines, the lower Y line selection switch being disposed at another side of the Y decoder from the upper Y line selection switch along the Y direction,
the switch circuit is configured to be capable of switching so as to permit either conduction between the sense amplifier and the upper Y line selection switch or conduction between the sense amplifier and the lower Y line selection switch,
the Y decoder includes:
a data latch circuit; and
a first switch and a second switch disposed in a path on which data is set by the data latch circuit,
the first switch is driven by a load signal, the first switch being disposed adjacent to the data latch circuit, and
the second switch is driven by a page set enable signal and a Y line select signal, the second switch being disposed adjacent to the first switch.

2. The memory device according to claim 1, further comprising:
a first high voltage pulse generator and a second high voltage pulse generator configured to generate high-voltage pulses in a write operation,
wherein
the Y decoder includes:
a first transistor having
a control terminal driven by data latched by the data latch circuit,
a first terminal connected to an output terminal of the first high voltage pulse generator, and
a second terminal connected to the upper bit lines; and
a second transistor having
a control terminal driven by the data latched by the data latch circuit,
a first terminal connected to an output terminal of the second high voltage pulse generator, and
a second terminal connected to the lower bit lines.

3. The memory device according to claim 2, wherein
the Y decoder includes a clamp circuit configured to be capable of applying a clamp voltage to the upper or lower bit lines when, with the first and second transistors off, the first or second high voltage pulse generator generates a high voltage.

4. The memory device according to claim 1, wherein
a wiring length from the sense amplifier via the switch circuit to the upper Y line selection switch is equal to a wiring length from the sense amplifier via the switch circuit SWC to the lower Y line selection switch.

5. A memory device, comprising:
an upper memory array configured to have memory cells disposed in a matrix along mutually orthogonal X and Y directions;
a lower memory array configured to have memory cells disposed in a matrix along the X and Y directions, the lower memory array being disposed at another side of the upper memory array along the Y direction;
a Y decoder configured to be disposed to be located between the upper and lower memory arrays along the Y direction as seen in a plan view;
a sense amplifier; and
a switch circuit,
wherein
upper bit lines connected to the memory cells in the upper memory array extend in the Y direction in the upper memory array and the Y decoder;
lower bit lines connected to the memory cells in the lower memory array extend in the Y direction in the lower memory array and the Y decoder;
the Y decoder includes:
an upper Y line selection switch connected to the upper bit lines; and
a lower Y line selection switch connected to the lower bit lines, the lower Y line selection switch being disposed at another side of the Y decoder from the upper Y line selection switch along the Y direction,
the switch circuit is configured to be capable of switching so as to permit either conduction between the sense amplifier and the upper Y line selection switch or conduction between the sense amplifier and the lower Y line selection switch,
the memory device further includes a first high voltage pulse generator and a second high voltage pulse generator configured to generate high-voltage pulses in a write operation, and
the Y decoder includes:
a data latch circuit;
a first transistor having a control terminal configured to be driven by data latched by the data latch circuit, a first terminal connected to an output terminal of the first high voltage pulse generator, and a second terminal connected to the upper bit lines; and
a second transistor having a control terminal configured to be driven by the data latched by the data latch circuit, a first terminal connected to an output terminal of the second high voltage pulse generator, and a second terminal connected to the lower bit lines.

6. The memory device according to claim 5, wherein
the Y decoder includes a first switch and a second switch disposed in a path on which data is set by the data latch circuit,
the first switch is configured to be driven by a load signal, the first switch being disposed adjacent to the data latch circuit, and the second switch is configured to be driven by a page set enable signal and a Y line select signal, the second switch being disposed adjacent to the first switch.

7. The memory device according to claim 5, wherein the Y decoder includes a third switch disposed in a path on which data is set by the data latch circuit, the third switch is configured to be driven by a load signal, a page set enable signal, and a Y line select signal, the third switch being disposed adjacent to the data latch circuit.

8. The memory device according to claim 5, wherein the Y decoder includes a clamp circuit configured to be capable of applying a clamp voltage to the upper or lower bit lines when, with the first and second transistors off, the first or second high voltage pulse generator generates a high voltage.

9. The memory device according to claim 5, wherein a wiring length from the sense amplifier via the switch circuit to the upper Y line selection switch is equal to a wiring length from the sense amplifier via the switch circuit SWC to the lower Y line selection switch.

10. A memory device, comprising:

an upper memory array configured to have memory cells disposed in a matrix along mutually orthogonal X and Y directions;

a lower memory array configured to have memory cells disposed in a matrix along the X and Y directions, the lower memory array being disposed at another side of the upper memory array along the Y direction;

a Y decoder configured to be disposed to be located between the upper and lower memory arrays along the Y direction as seen in a plan view;

a sense amplifier; and a switch circuit, wherein upper bit lines connected to the memory cells in the upper memory array extend in the Y direction in the upper memory array and the Y decoder;

lower bit lines connected to the memory cells in the lower memory array extend in the Y direction in the lower memory array and the Y decoder;

the Y decoder includes:

an upper Y line selection switch connected to the upper bit lines; and a lower Y line selection switch connected to the lower bit lines, the lower Y line selection switch being disposed at another side of the Y decoder from the upper Y line selection switch along the Y direction, the switch circuit is configured to be capable of switching so as to permit either conduction between the sense amplifier and the upper Y line selection switch or conduction between the sense amplifier and the lower Y line selection switch, and a wiring length from the sense amplifier via the switch circuit to the upper Y line selection switch is equal to a wiring length from the sense amplifier via the switch circuit SWC to the lower Y line selection switch.

* * * * *